United States Patent [19]
Bando et al.

[11] Patent Number: 6,031,788
[45] Date of Patent: Feb. 29, 2000

[54] SEMICONDUCTOR INTEGRATED CIRCUIT

[75] Inventors: Yoshihide Bando; Nobutaka Taniguchi; Hiroyoshi Tomita, all of Kawasaki, Japan

[73] Assignee: Fujitsu Limited, Kanagawa, Japan

[21] Appl. No.: 09/207,335

[22] Filed: Dec. 8, 1998

[30] Foreign Application Priority Data

Dec. 16, 1997 [JP] Japan ................................. 9-346767

[51] Int. Cl.$^7$ ...................................................... G11C 7/00
[52] U.S. Cl. ........................................ 365/233; 365/230.08
[58] Field of Search .............................. 365/233, 230.03, 365/230.06, 230.08

[56] References Cited

U.S. PATENT DOCUMENTS 5,315,552  5/1994  Yoneda .............................. 365/230.03
5,406,520  4/1995  Tay ..................................... 365/230.03

*Primary Examiner*—Vu A. Le
*Attorney, Agent, or Firm*—Nikaido, Marmelstein, Murray & Oram LLP

[57] ABSTRACT

A semiconductor integrated circuit is adapted to make invalid an external clock, externally supplied to the semiconductor integrated circuit, when the semiconductor integrated circuit is set in an active power-down state. The semiconductor integrated circuit includes a delay locked loop DLL circuit which outputs an internal clock which phase is synchronized to the external clock. A latch circuit retains control signals in synchronism with the internal clock output by the DLL circuit. An internal circuit performs a predetermined process based on the control signals supplied from the latch circuit.

11 Claims, 19 Drawing Sheets

MAY AFFECT A SUBSEQUENT-STAGE CIRCUIT

FIG. 15

| CURRENT STATE | CKE | $\overline{CS}$ | $\overline{RAS}$ | $\overline{CAS}$ | $\overline{WE}$ | ADDRESS | FUNCTION |
|---|---|---|---|---|---|---|---|
| ACTIVE POWER-DOWN STATE | H | H | X | X | X | X | SHIFTED TO ACTIVE STATE |
|  | H | L | H | H | H | X |  |
| ACTIVE STATE | L | H | X | X | X | X | SHIFTED TO ACTIVE POWER-DOWN STATE |
|  | L | L | H | H | H | X |  |

SEMICONDUCTOR INTEGRATED CIRCUIT

BACKGROUND OF THE INVENTION (1) Field of the Invention

The present invention relates to a semiconductor integrated circuit device in which a delay locked loop DLL circuit is provided.

With high speed and high integration of recent semiconductor integrated circuit devices, such as an SDRAM, it is important to stably supply an internal clock which phase is synchronized to an external clock to an internal circuit of the semiconductor integrated circuit device. A semiconductor integrated circuit device utilizes a delay locked loop DLL circuit to produce an internal clock which phase is synchronized to an external clock for supplying control signals to the internal circuit in synchronism with the internal clock. The DLL circuit acts to adjust a timing of the supply of the internal clock with high accuracy.

In addition, with high speed and high integration of recent semiconductor integrated circuit devices, the power consumption is likely to increase. To avoid this, there is a demand for a semiconductor integrated circuit device able to work with a low level of power consumption.

(2) Description of the Related Art

A description will now be given of a conventional SDRAM in order to give an example of a conventional semiconductor integrated circuit device.

Suppose that the conventional SDRAM can be set in an "active power-down" state. If the conventional SDRAM is set in the active power-down state, all external clocks, subsequently supplied to the conventional SDRAM from the external element are made invalid.

FIG. 19 shows a control signal generator provided in a conventional SDRAM. As shown in FIG. 19, in the conventional SDRAM, data is written to or read from a DRAM CORE (not shown) in synchronism with an internal clock (INT CLK).

In the control signal generator of FIG. 19, an external clock (EXT CLK), which is externally supplied to the conventional SDRAM, and an externally controlled clock enable signal (CKE) are input to an AND gate 301, and the AND gate 301 outputs an internal clock (INT CLK) which is to be supplied to a plurality of latches 302 through 305 and an internal circuit 306 of the conventional SDRAM. When the CKE at the input of the AND gate 301 is set at a high (H) level, the INT CLK output by the AND gate 301 is supplied to the latches 302 through 305 and the internal circuit 306. When the CKE is set at a low (L) level, the AND gate 301 does not output the INT CLK, and the supply of the INT CLK to the elements of the conventional SDRAM is inhibited.

When the CKE is set at the L level and control signals at the input of the control signal generator are set in a predetermined condition, the SDRAM is set in the active power-down state. Hereinafter, the predetermined condition will be called the active power-down setting condition. The above-mentioned control signals are, for example, a chip select (CS) signal, a row address select (RAS) signal, a column address select (CAS) signal and a write enable (WE) signal which are supplied to the latches 302, 303, 304 and 305, respectively.

In the control signal generator of FIG. 19, the control signals are retained by the latches 302–305 in synchronism with the INT CLK. Further, the retained control signals LATCH CS, LATCH RAS, LATCH CAS and LATCH WE are supplied from the latches 302–305 to the internal circuit 306 in synchronism with the INT CLK. The internal circuit 306 includes other elements of the conventional SDRAM, different from the AND gate 301 and the latches 302–205. For example, the internal circuit 306 may include the DRAM CORE and a command decoder (which acts to determine whether the active power-down setting condition is satisfied).

FIG. 20 is a time chart for explaining an operation of the control signal generator of the conventional SDRAM of FIG. 19. In FIG. 20, T1 indicates a time a rising edge of the EXT CLK occurs, and T2 indicates a time a falling edge of the CKE occurs.

As shown in FIG. 20, when the CKE is at the H level and the EXT CLK is set from the L level to the H level (or at the rising edge) at the time "T1", the INT CLK output by the AND gate 301 is set at the H level with a certain delay. That is, a rising edge of the INT CLK occurs after the certain delay from the rising edge of the EXT CLK. In synchronism with the rising edge of the INT CLK, the control signals CS, RAS, CAS and WE are retained by the latches 302, 303, 304 and 305, and all the retained control signals LATCH CS, LATCH RAS, LATCH CAS and LATCH WE are set at the H level. That is, the conventional SDRAM is set in the active state.

Further, as shown in FIG. 20, when the CKE is set at the L level at the time T2 (during the active state), the active power-down setting condition of the conventional SDRAM is satisfied. The conventional SDRAM at this time is set in the active power-down state. That is, the EXT CLK is made invalid. In the conventional SDRAM, when it is set in the active power-down state, supplying the INT CLE to the latches 302–305 and the internal circuit 306 is inhibited. The control signals supplied to the latches 302–305 are disregarded with no regard as to whether the control signals are set at the H level or the L level, as indicated by the shaded lines in FIG. 20. The latches 302–305 are held in the conditions that are the same as those before the active power-down state of the conventional SDRAM starts.

In the conventional SDRAM, the latches 302–305 are continuously held in the previous conditions until the active power-down state is terminated or canceled. That is, the latches 302–305 remains in the previous conditions until the CKE is set at the H level and the operation of the INT CLK is started.

However, if the working frequency of a the conventional SDRAM is increased, the time the INT CLK is set at the H level or the L level in response to the level of the EXT CLK is considerably delayed. In such a case, the conventional SDRAM is likely to malfunction due to a delay of the INT CLK relative to the EXT CLK.

SUMMARY OF THE INVENTION

An object of the present invention is to provide an improved semiconductor integrated circuit device in which the above-mentioned problems are eliminated.

Another object of the present invention is to provide a semiconductor integrated circuit including a DLL circuit which outputs an internal clock which phase is accurately synchronized to an external clock, so that control signals are supplied to an internal circuit in synchronism with the internal clock without delay relative to the external clock.

Still another object of the present invention is to provide a semiconductor integrated circuit which allows the operation of the semiconductor integrated circuit with a low level of power consumption.

The above-mentioned objects of the present invention are achieved by a semiconductor integrated circuit in which an external clock, externally supplied to the semiconductor integrated circuit, is made invalid when the semiconductor integrated circuit is set in an active power-down state, the semiconductor integrated circuit including: a delay locked loop DLL circuit which outputs an internal clock which phase is synchronized to the external clock; a latch circuit which retains control signals in synchronism with the internal clock output by the DLL circuit; and an internal circuit which performs a predetermined process based on the control signals supplied from the latch circuit.

The semiconductor integrated circuit of a preferred embodiment of the present invention includes the DLL circuit which outputs the internal clock which phase is accurately synchronized to the external clock, so that control signals are supplied to the internal circuit in synchronism with the internal clock without delay relative to the external clock. Hence, the semiconductor integrated circuit is effective in preventing a malfunction of the semiconductor integrated circuit due to a delay of the internal clock relative to the external clock. Even if the working frequency of the semiconductor integrated circuit is increased, the internal clock is set at the high level or the low level in response to the level of the external clock without delay. In synchronism with the internal clock, the control signals are retained by the latch circuit, and the retained control signals are supplied to the internal circuit.

Further, in the semiconductor integrated circuit of a preferred embodiment of the present invention when the clock enable signal is set at the low level during the active power-down state, the retained control signals are not supplied to the internal circuit. The operation of the internal circuit is stopped. Hence, the semiconductor integrated circuit of the preferred embodiment is effective in reducing the power consumption.

BRIEF DESCRIPTION OF THE DRAWINGS

Other objects, features and advantages of the present invention will become more apparent from the following detailed description when read in conjunction with the accompanying drawings in which:

FIG. 15 is a diagram for explaining conditions of control signals needed to shift the SDRAM from one of an active state and an active power-down state to the other;

DESCRIPTION OF THE PREFERRED EMBODIMENTS

A description will now be given of the preferred embodiments of the present invention with reference to the accompanying drawings.

In the following, an SDRAM will be described in order to give an example of a semiconductor integrated circuit device of the present invention, for the sake of convenience of description.

Figure 14:
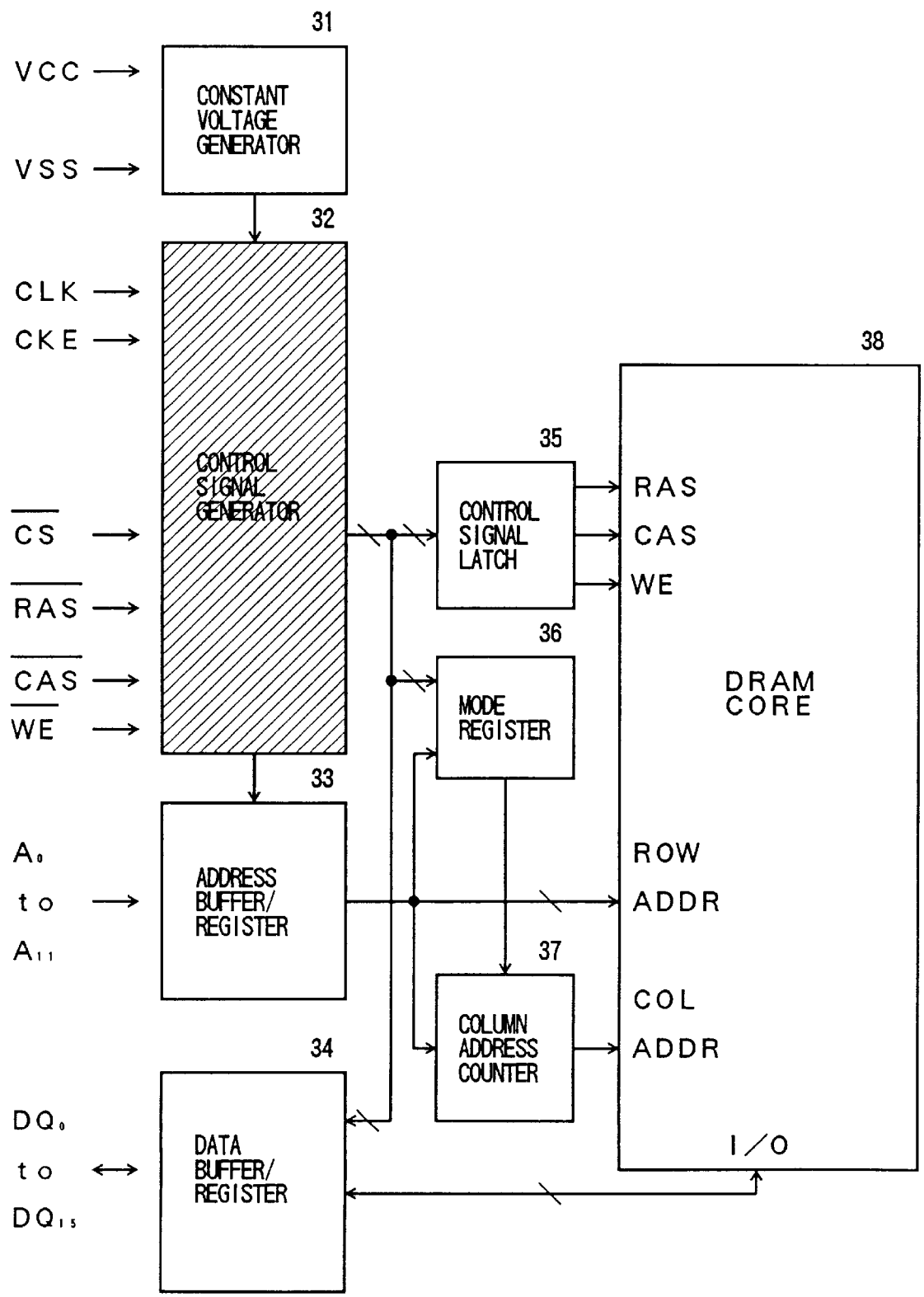
FIG. 14 is a block diagram of an SDRAM to which a semiconductor integrated circuit device embodying the present invention is applied.

FIG. 14 shows a configuration of the SDRAM to which a semiconductor integrated circuit device embodying the present invention is applied.

As shown in FIG. 14, the SDRAM includes a DRAM CORE 38 for storing data therein. A constant voltage generator 31 supplies a constant voltage to the respective elements of the SDRAM. A control signal generator 32 is capable of decoding an externally supplied command, and latches control signals in synchronism with an externally supplied clock. An address buffer/register 33 retains an externally supplied address signal and supplies a row address signal (ROW ADDR) to the DRAM CORE 38. A data buffer/register 34 retains a data signal which is indicative of either data written to the DRAM CORE 38 or data read from the DRAM CORE 38. A control signal latch 35 supplies the control signals retained by the control signal generator 32, to the DRAM CORE 38. A mode register 36 selects one of various operational modes and sets the SDRAM in the selected operational mode. A column address counter 37 supplies a column address signal (COL ADDR) to the DRAM CORE 38 based on the operational mode selected by the mode register 36.

Figure 19:
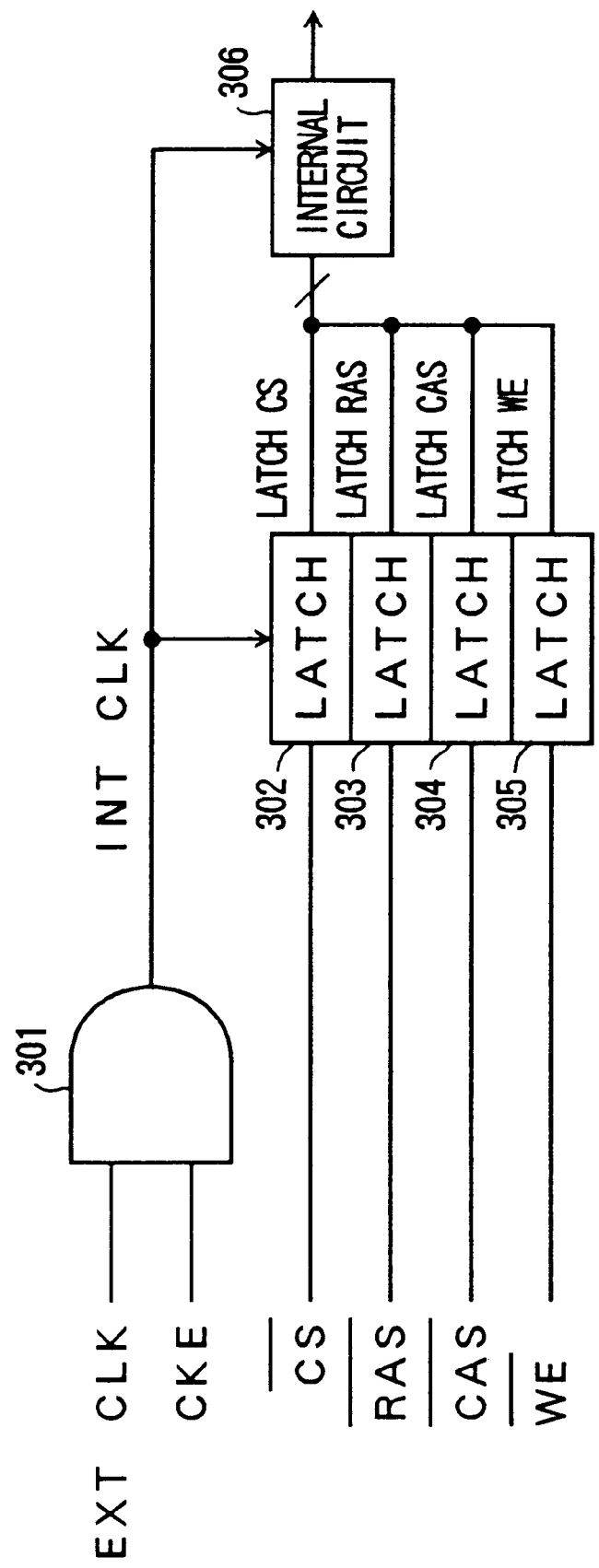
FIG. 19 is a block diagram of a control signal generator of a conventional SDRAM.
Figure 20:
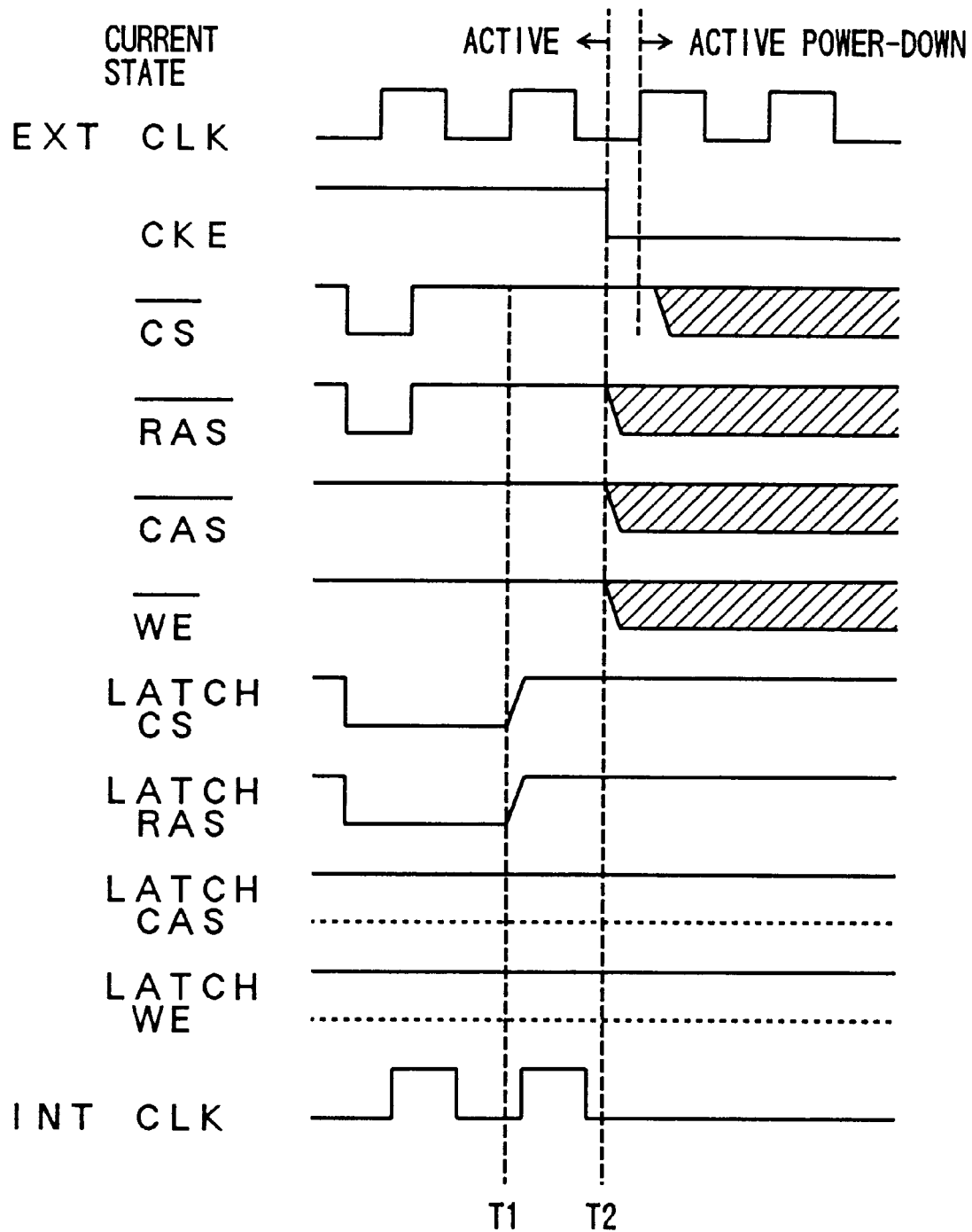
FIG. 20 is a time chart for explaining an operation of the control signal generator of FIG. 19.

Similar to the conventional SDRAM of FIG. 19, in the SDRAM of FIG. 14, the external clock (CLK), the clock enable signal (CKE), the chip select (CS) signal, the row address select (RAS) signal, the column address select (CAS) signal and the write enable (WE) signal are externally supplied to the control signal generator 32. A data writing process to write data to the DRAM CORE 38 or a data reading process to read data from the DRAM CORE 38 are performed based on the control signals supplied from the control signal generator 32.

In the SDRAM of FIG. 14, suppose that the address signal at the input of the address buffer/register 33 is comprised of a number of address element signals (A0, A1, . . . , An) where n is an integer indicating the number of bits of the data, and that the data signal at the input of the data buffer/register 34 is comprised of a number of data element signals (DQ0, DQ1, . . . , DQn) where n is an integer indicating the number of bits of the data.

With high speed and high integration of a SDRAM, it is important to stably supply an internal clock (INT CLK) which phase is synchronized to the external clock (EXT CLK) to an internal circuit of the SDRAM with accuracy. The internal circuit may include the latches of the control signal generator 32 and the control signal latch 35. If the working frequency of the SDRAM is increased, the time the INT CLK is set at the H level or the L level in response to the level of the EXT CLK is considerably delayed. In such a case, the SDRAM is likely to malfunction due to a delay of the INT CLK relative to the EXT CLK.

In order to eliminate the problem of the above-mentioned SDRAM, the SDRAM of FIG. 14 includes an improved DLL circuit which outputs the INT CLK which phase is accurately synchronized to the EXT CLK, so that control signals are supplied to the internal circuit of the SDRAM in synchronism with the INT CLK without delay relative to the EXT CLK. Hence, the SDRAM of FIG. 14 is effective in preventing a malfunction of the SDRAM due the delay of the INT CLK.

Figure 1:
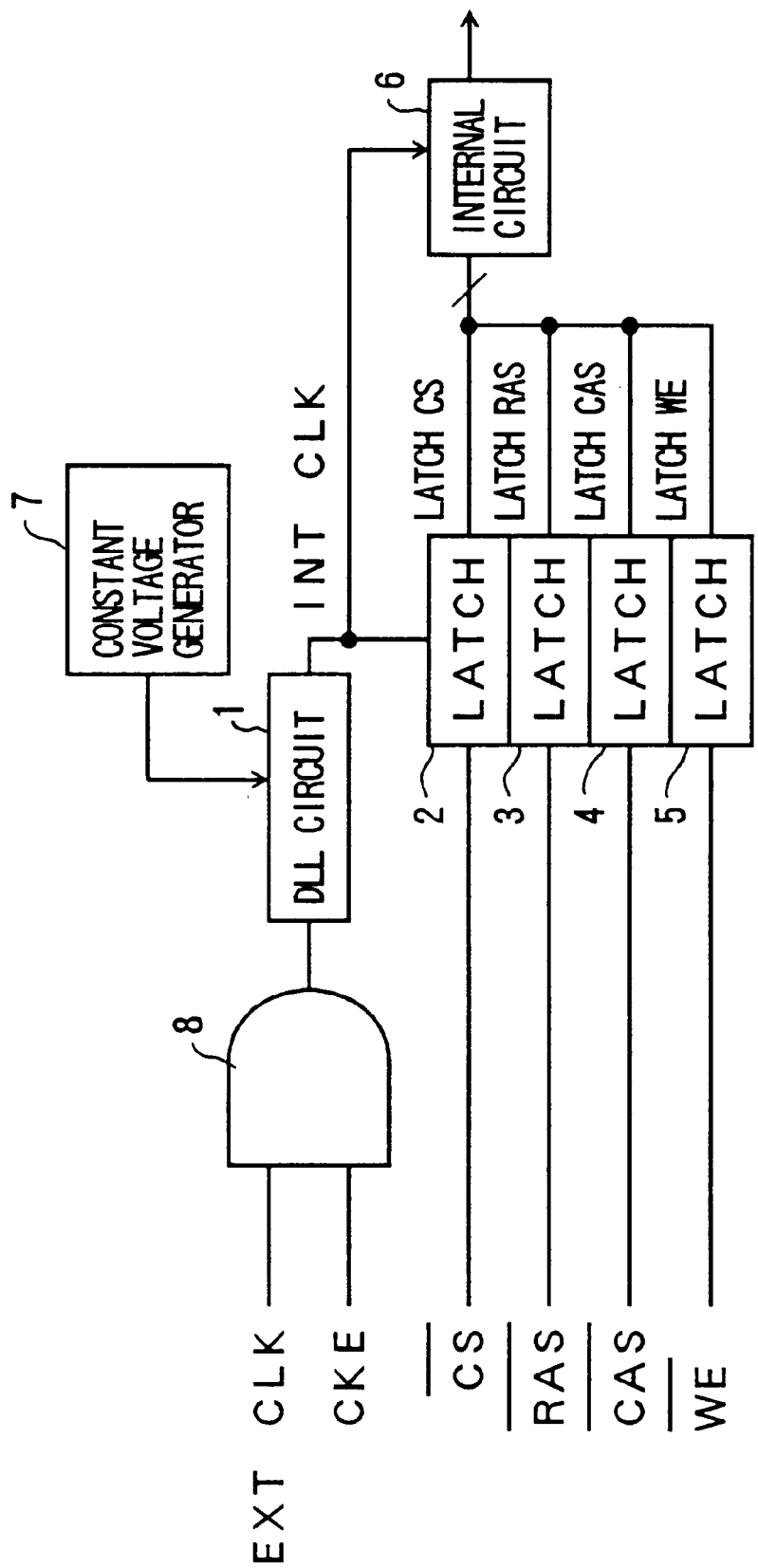
FIG. 1 is a block diagram of a first embodiment of a control signal generator provided in a SDRAM according to the present invention.

FIG. 1 shows a first embodiment of the control signal generator 32 provided in the SDRAM according to the present invention. The control signal generator 32 of the present embodiment is intended to effectively prevent the malfunction of the SDRAM due the delay of the INT CLK, and allows the operation of the SDRAM with a low level of power consumption.

As shown in FIG. 1, the control signal generator 32 generally has a DLL circuit 1, a plurality of latches 2, 3, 4 and 5, a constant voltage generator 7, and an AND gate 8. Further, an internal circuit 6 of the SDRAM is shown in FIG. 1. For the sake of convenience of description, suppose that the internal circuit 6 includes a command decoder of the control signal generator 32, the control signal latch 35, and other elements of the SDRAM shown in FIG. 14.

In the control signal generator 32 of FIG. 1, the constant voltage generator 7 supplies a constant voltage to the DLL circuit 1 during an operation of the SDRAM.

In the control signal generator 32 of FIG. 1, the external clock (EXT CLK) and the clock enable signal (CKE) are input to the AND gate 8, and the EXT CLK is supplied through the AND gate 8 to the DLL circuit 1. When the CKE at the input of the AND gate 8 is set at a high (H) level, the DLL circuit 1 outputs an internal clock (INT CLK) which is to be supplied to the latches 2–5 and the internal circuit 6. On the other hand, when the CKE is set at a low (L) level, the AND gate 8 does not output the EXT CLK to the DLL circuit 1, and the supply of the INT CLK to the latches 2–5 and the internal circuit 6 by the DLL circuit 1 is inhibited.

When the CKE is set at the L level and the control signals at the inputs of the latches 2–5 are set in the active power-down setting condition, the SDRAM is set from the active state to the active power-down state. FIG. 15 shows conditions of the control signals needed to shift the SDRAM from one of the active state and the active power-down state to the other. As shown in FIG. 15, in the present embodiment, the control signals are in the active power-down setting condition when the CS signal is at the L level, the RAS signal is at the H level, the CAS signal is at the H level, and the WE signal is at the H level, or when the CS signal is at the H level, and the RAS, CAS and WE signals are either at the H level or at the L level. In FIG. 15, "X" indicates that the control signal of concern is either at the H level or at the L level.

In the control signal generator 32 of FIG. 1, the control signals CS, RAS, CAS and WE are retained by the latches 2, 3, 4 and 5 in synchronism with the INT CLK supplied by the DLL circuit 1. Further, the retained control signals LATCH CS, LATCH RAS, LATCH CAS and LATCH WE are supplied from the latches 2–5 to the internal circuit 6 in synchronism with the INT CLK supplied by the DLL circuit 1.

Figure 2:
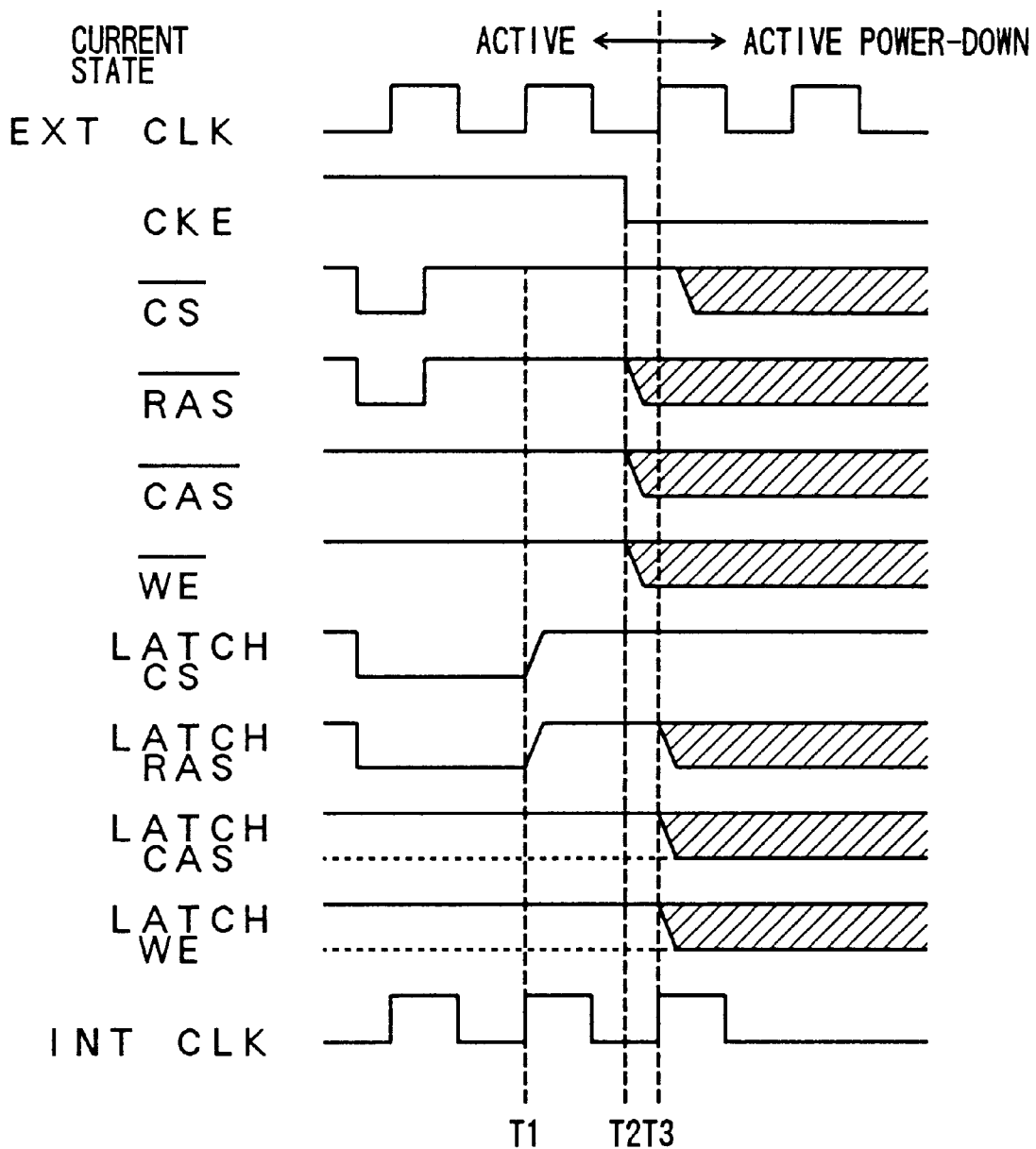
FIG. 2 is a time chart for explaining an operation of the control signal generator of FIG. 1.

FIG. 2 is a time chart for explaining an operation of the control signal generator 32 of FIG. 1. In FIG. 2, T1 indicates a time a rising edge of the EXT CLE occurs, T2 indicates a time a falling edge of the CKE occurs, and T3 indicates a time a rising edge of the EXT CLK occurs after the CKE is set at the L level.

As shown in FIG. 2, when the CKE is at the H level and the EXT CLK is set from the L level to the H level (or the rising edge of the EXT CLK) at the time "T1", the INT CLK which phase is accurately synchronized to the EXT CLK is supplied to the latches 2–5 by the DLL circuit 1. That is, a rising edge of the INT CLK occurs simultaneously with the rising edge of the EXT CLK. In synchronism with the rising edge of the INT CLK, the control signals CS, RAS, CAS and WE are retained by the latches 2, 3, 4 and 5, and the active state of the SDRAM is established so that all the retained control signals LATCH CS, LATCH RAS, LATCH CAS and LATCH WE are set at the H level.

Further, as shown in FIG. 2, when the CKE is set at the L level at the time T2 during the active state of the SDRAM, the active power-down setting condition shown in FIG. 15 is satisfied. The SDRAM is set from the active state to the active power-down state. That is, the EXT CLK is made invalid even when the rising edge of the EXT CLK occurs at the time T3. In the SDRAM, when it is set in the active power-down state, the EXT CLK is not supplied to the DLL circuit 1, and supplying the INT CLK to the latches 2–5 and the internal circuit 6 is inhibited. The control signals supplied to the latches 2–5 are disregarded with no regard as to whether the control signals are set at the H level or the L level, as indicated by the shaded lines in FIG. 2. The latches 2–5 are held in the conditions that are the same as those at the last rising edge of the INT CLK at the time T3.

In the SDRAM, the latches 2–5 are continuously held in the previous conditions until the active power-down state is terminated or canceled. The latches 2–5 remains in the previous conditions (or remains in the active power-down state) until an active state setting condition shown in FIG. 15 is satisfied again. That is, the SDRAM is not shifted to the active state until the CKE is set at the H level, the operation of the INT CLK is started, and the CS signal is set at the L level and the control signals RAS, CAS and WE are set at the H level, or until both the CKE and the CS are set at the H level, as shown in FIG. 15.

As described above, the control signal generator 32 of the present embodiment includes the DLL circuit 1 which outputs the INT CLK which phase is accurately synchronized to the EXT CLK, so that the control signals are supplied to the internal circuit in synchronism with the INT CLK without delay relative to the EXT CLK. Hence, the control signal generator 32 of the present embodiment is effective in preventing a malfunction of the SDRAM due to a delay of the INT CLK relative to the EXT CLK. Even if the working frequency of the SDRAM is increased, the INT CLK is set at the H level or the L level in response to the level of the EXT CLK without delay. The rising edge of the INT CLK produced by the DLL circuit 1 occurs simultaneously with the rising edge of the EXT CLK. In synchronism with the rising edge of the INT CLX, the control signals CS, RAS, CAS and WE are retained by the latches 2, 3, 4 and 5, and the retained control signals LATCH CS, LATCH RAS, LATCH CAS and LATCH WE are set at the H level. Hence, the semiconductor integrated circuit device of the present embodiment is effective in preventing the malfunction due to the delay of the INT CLK relative to the EXT CLK.

Further, when the CKE is set at the L level during the active state, the EXT CLX is not supplied to the DLL circuit 1. The DLL circuit 1 does not output the INT CLK, and no INT CLX is supplied to the latches 2–5 or the internal circuit 6. Hence, the control signal generator 32 of the present embodiment is effective in reducing the power consumption of the latches 2–5 and the internal circuit 6 in the SDRAM.

Figure 3:
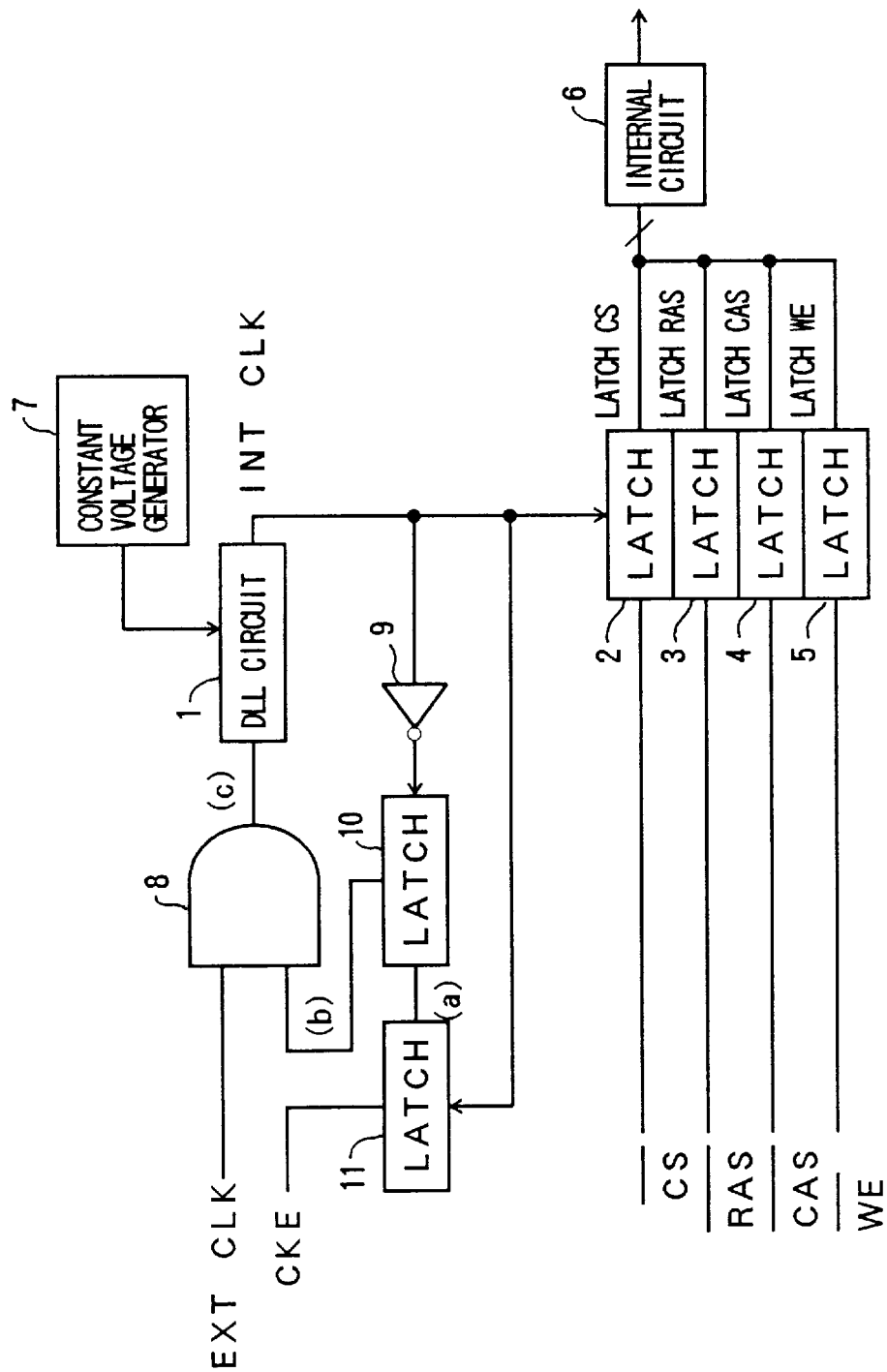
FIG. 3 is a block diagram of a second embodiment of the control signal generator in the SDRAM according to the present invention.

Next, FIG. 3 shows a second embodiment of the control signal generator 32 in the SDRAM according to the present invention. The control signal generator 32 of the present embodiment is intended to improve the previous embodiment of FIG. 1.

As shown in FIG. 3, the control signal generator 32 of the present embodiment includes the DLL circuit 1, the plurality of latches 2, 3, 4 and 5, the constant voltage generator 7 and the AND gate 8. These elements in the present embodiment are essentially the same as corresponding elements in FIG. 1, and designated by the same reference numerals and a description thereof will be omitted. The control signal generator 32 of the present embodiment further includes an inverter 9, a second latch 10 and a first latch 11, as shown in FIG. 3. Further, the internal circuit 6 of the SDRAM is shown in FIG. 3. For the sake of convenience of description, suppose that the internal circuit 6 includes a command decoder of the control signal generator 32, the control signal latch 35, and other elements of the SDRAM shown in FIG. 14.

In the previous embodiment of FIG. 1, the clock enable signal (CKE) and the external clock (EXT CLK) are not in synchronism with each other. Hence, there is the possibility that the DLL circuit 1 outputs an INT CLK pulse having a short period that is smaller than one period of the EXT CLK.

Figure 4:
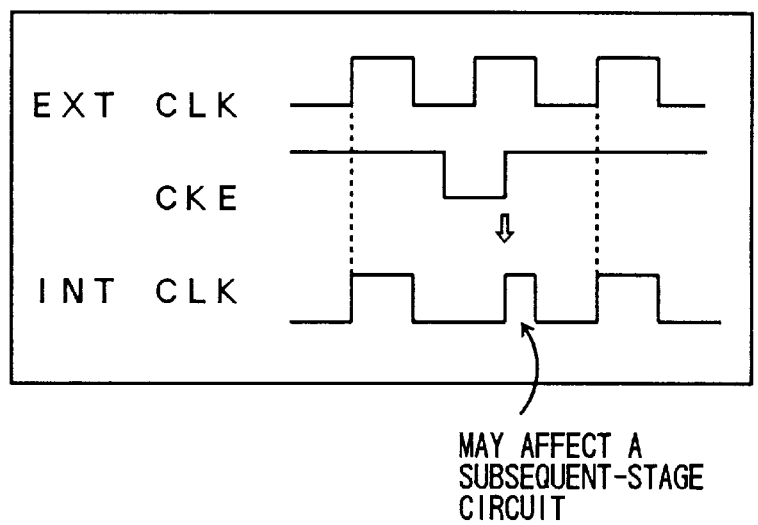
FIG. 4 is a time chart for explaining a problem of the operation of the control signal generator of FIG. 1.

FIG. 4 is a time chart for explaining a problem of the operation of the control signal generator of FIG. 1. In the control signal generator 32 of the FIG. 1, no latch is provided at the input of the AND gate 8 and the CKE is supplied directly to the AND gate 8. As shown in FIG. 4, the INT CLK pulse having a short period that is smaller than one period of the EXT CLK, may be produced by the DLL circuit 1, and this pulse may affect a subsequent-stage circuit of the SDRAM.

In the control signal generator 32 of the present embodiment of FIG. 3, the external clock (EXT CLK) is supplied to a first input of the AND gate 8, and the first latch 11 has a first input to which the clock enable signal (CKE) is externally supplied, a second input connected to an output of the DLL circuit 1, and an output connected to a first input of the second latch 10. The inverter 9 has an input connected to the output of the DLL circuit 1 and an output connected to a second input of the second latch 10. The second latch 10 has the first input connected to the first latch 11, the second input connected to the inverter 9, and an output connected to a second input of the AND gate 8. The AND gate 8 has an output connected to the input of the DLL circuit 1.

In the control signal generator 32 of FIG. 3, the clock enable signal CKE is supplied through the first and second latches 11 and 10 to the second input of the AND gate 8.

Figure 5:
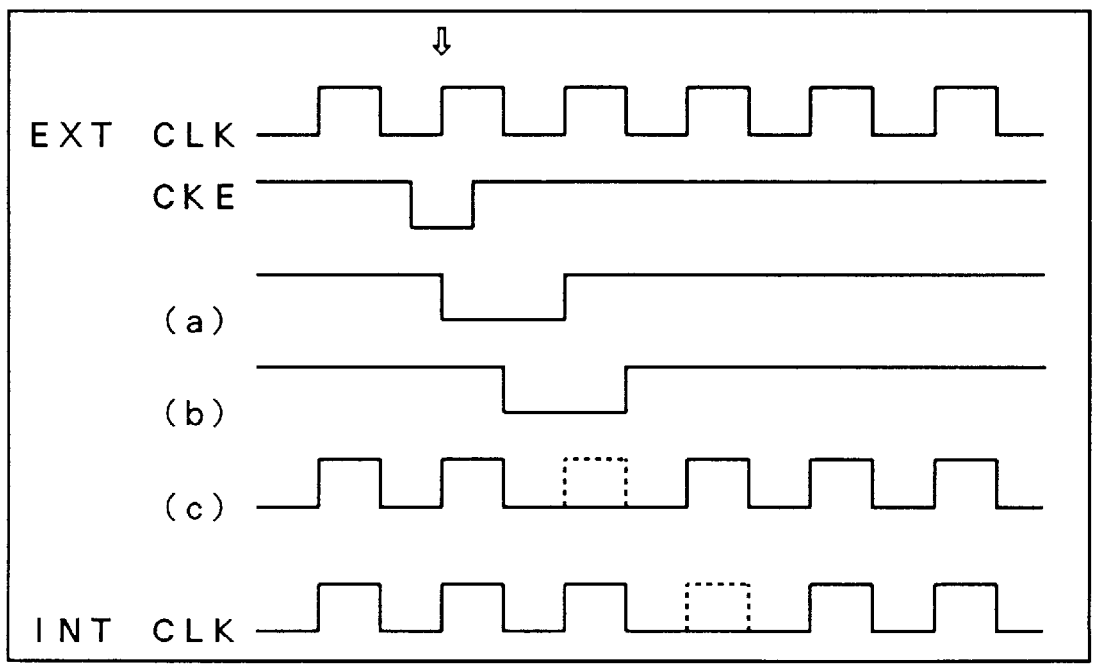
FIG. 5 is a time chart for explaining an operation of the control signal generator of FIG. 3.

FIG. 5 is a time chart for explaining an operation of the control signal generator 32 of FIG. 3 in which the first and second latches 11 and 10 are provided at the input of the AND gate 8. In FIG. 5, (a) indicates an ON/OFF state of the CKE output by the first latch 11, (b) indicates an ON/OFF state of the CKE output by the second latch 10, and (c) indicates an ON/OFF state of the signal output by the AND gate 8.

As shown in FIG. 5, the EXT CLK and the CKE (b) at the input of the AND gate 8 are in synchronism with each other, and one pulse (indicated by a dotted line in FIG. 5) of the signal (c) at the output of the AND gate 8 is canceled. Hence, there is no possibility that the DLL circuit 1 outputs an INT CLK pulse having the short period shown in FIG. 4.

In the control signal generator 32 of FIG. 3, the INT CLK output by the DLL circuit 1 is supplied directly to the first latch 11, and the first latch 11 latches the CKE in synchronism with a rising edge of the INT CLK. Further, the INT CLK output by the DLL circuit 1 is supplied through the inverter 9 to the second latch 10, and the second latch 11 latches the CKE in synchronism with a falling edge of the INT CLK. When the CKE (b) output by the second latch 10 is at the L level, the AND gate 8 does not output the signal (c), that is, one pulse (indicated by the dotted line in FIG. 5) of the signal (c) at the output of the AND gate 8 is canceled.

In the control signal generator 32 of FIG. 3, the signal (c) shown in FIG. 5 is supplied to the input of the DLL circuit 1. When the CKE (b) output by the second latch 10 is set at the H level, the DLL circuit 1 outputs the INT CLK which phase is accurately synchronized to the EXT CLK, and the INT CLK is supplied to the latches 2–5. When the CKE (b) output by the second latch 10 is set at the L level, the AND gate 8 does not output the signal (c) to the DLL circuit 1. In this case, the DLL circuit 1 does not output the INT CLK, and the supply of the INT CLK to the latches 2–5 is inhibited. As described above, when the CKE is set at the L level and the control signals CS, RAS, CAS and WE at the inputs of the latches 2–5 are set in the active power-down setting condition, the SDRAM is set in the active power-down state. In the present embodiment, the active power-down setting condition is, as shown in FIG. 15, that the CS signal is at the L level, the RAS signal is at the H level, the CAS signal is at the H level, and the WE signal is at the H level, or that the CS signal is at the H level, and the RAS, CAS and WE signals are either at the H level or at the L level.

In the control signal generator 32 of FIG. 3, the control signals CS, RAS, CAS and WE are retained by the latches 2, 3, 4 and 5 in synchronism with the INT CLK supplied by the DLL circuit 1. Further, the retained control signals LATCH CS, LATCH RAS, LATCH CAS and LATCH WE are supplied from the latches 2–5 to the internal circuit 6 in synchronism with the INT CLR supplied by the DLL circuit 1.

Figure 6:
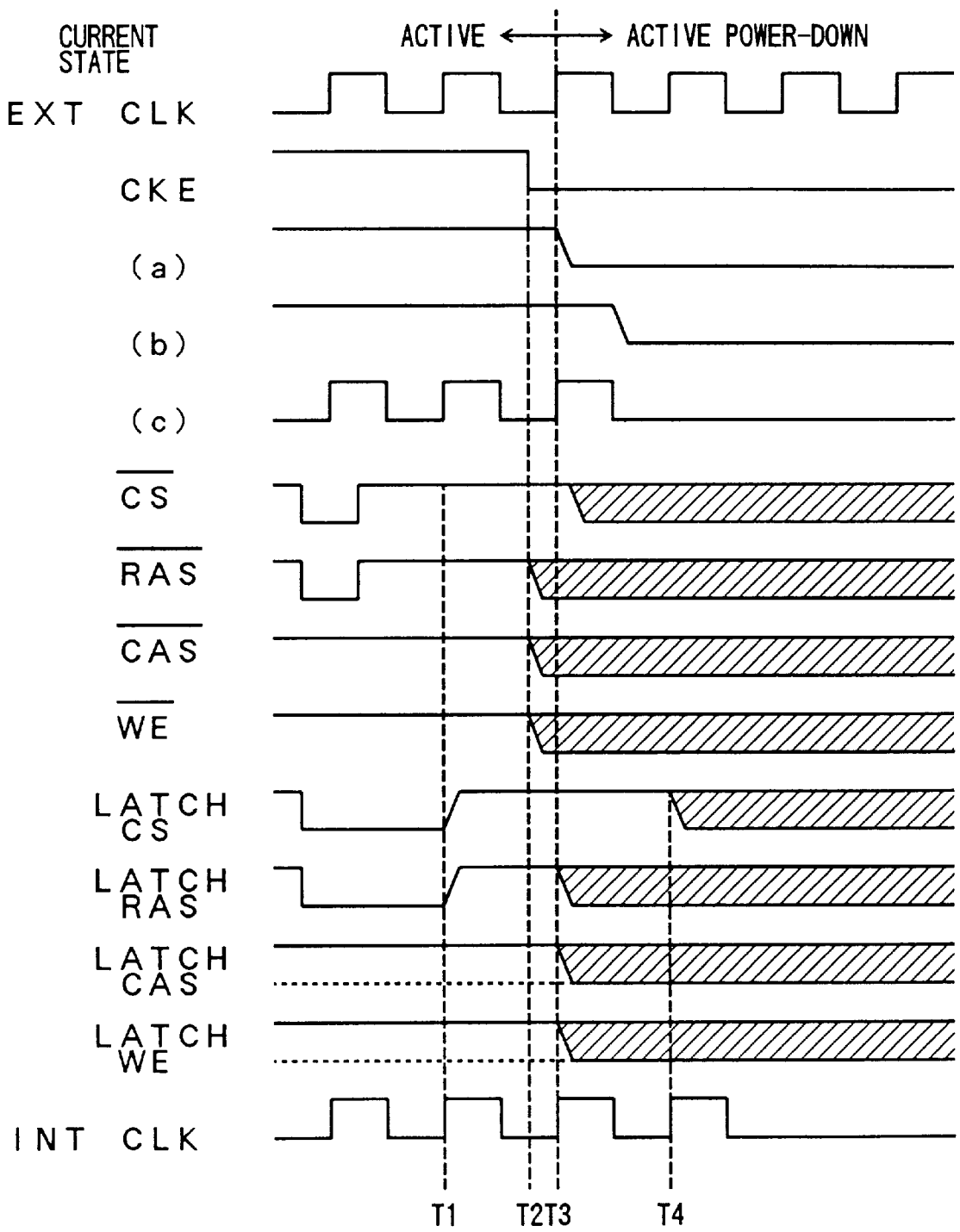
FIG. 6 is a time chart for explaining an operation of the control signal generator of FIG. 3.

FIG. 6 is a time chart for explaining an operation of the control signal generator of FIG. 3. In FIG. 6, T1 indicates a time a rising edge of the INT CLK occurs during the active state, T2 indicates a time a falling edge of the CKE occurs during the active state, T3 indicates a time a first rising edge of the INT CLE occurs after the CKE is set at the L level, and T4 indicates a time a final rising edge of the INT CLK occurs after the CKE is set at the L level. As described above, in the present embodiment, the EXT CLK and the INT CLK are in synchronism with each other.

As shown in FIG. 6, when the CKE is at the H level and the EXT CLK is set from the L level to the H level (or the rising edge of the EXT CLK) at the time "T1", the INT CLK which phase is accurately synchronized to the EXT CLK is supplied to the latches 2–5 by the DLL circuit 1. That is, at the time T1, the rising edge of the INT CLK occurs simultaneously with the rising edge of the EXT CLK. In synchronism with the rising edge of the INT CLK the control signals CS, RAS, CAS and WE are retained by the latches 2, 3, 4 and 5, and the active state of the SDRAM is established so that all the retained control signals LATCH CS, LATCH RAS, LATCH CAS and LATCH WE are set at the H level.

Further, as shown in FIG. 6, when the CKE is set at the L level at the time T2 during the active state of the SDRAM, the active power-down setting condition shown in FIG. 15 is satisfied. The SDRAM is set from the active state to the active power-down state. That is, the EXT CLK is made invalid even when the first rising edge of the INT CLK occurs at the time T3. In the SDRAM, when it is set in the active power-down state, the EXT CLK is not supplied to the DLL circuit 1, and the supply of the INT CLK to the latches 2–5 is inhibited. The control signals supplied to the latches 2–5 are disregarded with no regard as to whether the control signals are set at the H level or the L level, as indicated by the shaded lines in FIG. 6. The latches 2–5 are held in the conditions that are the same as those at the last rising edge of the INT CLK at the time T4.

In the SDRAM, the latches 2–5 are continuously held in the previous conditions until the active power-down state is terminated or canceled. The latches 2–5 remain in the previous conditions until the active state setting condition shown in FIG. 15 is satisfied again. That is, the SDRAM is not shifted to the active state until the CKE is set at the H level, the operation of the INT CLK is started, and the CS signal is set at the L level and the control signals RAS, CAS and WE are set at the H level, or until both the CKE and the CS are set at the H level. In the present embodiment, the number of the INT CLK pulses output by the DLL circuit 1 during the active power-down state is larger than that in the previous embodiment of FIG. 1 by one.

As described above, the control signal generator 32 of the present embodiment includes the DLL circuit 1 which outputs the INT CLK which phase is accurately synchronized to the EXT CLK, so that the control signals are supplied to the internal circuit in synchronism with the INT CLK without delay relative to the EXT CLK. Hence, the control signal generator 32 of the present embodiment is effective in preventing a malfunction of the SDRAM due to a delay of the INT CLK relative to the EXT CLK. Even if the working frequency of the SDRAM is increased, the INT CLK is set at the H level or the L level in response to the level of the EXT CLK without delay. The rising edge of the INT CLK output by the DLL circuit 1 occurs simultaneously with the rising edge of the EXT CLK. In synchronism with the rising edge of the INT CLK, the control signals CS, RAS, CAS and WE are retained by the latches 2, 3, 4 and 5, and the retained control signals LATCH CS, LATCH RAS, LATCH CAS and LATCH WE are set at the H level. Hence, the SDRAM of the present embodiment is effective in preventing the malfunction due to the delay of the INT CLK relative to the EXT CLK.

Further, when the CKE is set at the L level during the active state, the EXT CLK is not supplied to the DLL circuit 1. The DLL circuit 1 does not output the INT CLK, and no INT CLK is supplied to the latches 2–5 and the operation of the internal circuit 6 is stopped. Hence, the control signal generator 32 of the present embodiment is effective in reducing the power consumption of the latches 2–5 and the internal circuit 6 in the SDRAM.

Figure 7:
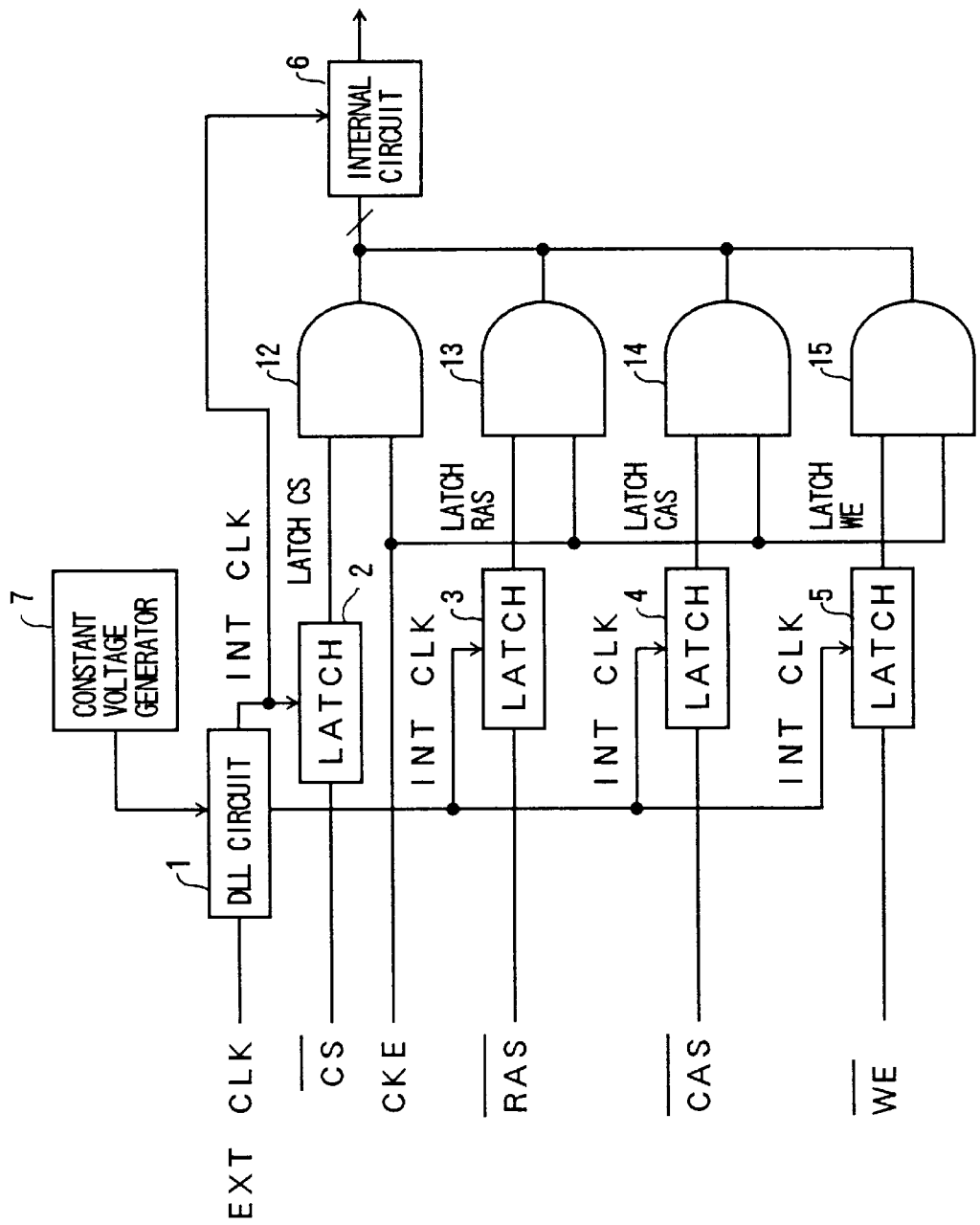
FIG. 7 is a block diagram of a third embodiment of the control signal generator in the SDRAM according to the present invention.

Next, FIG. 7 shows a third embodiment of the control signal generator 32 in the SDRAM according to the present invention. The control signal generator 32 of the present embodiment has a configuration that is different from the configuration of the previous embodiments of FIG. 1 and FIG. 3.

As shown in FIG. 7, the control signal generator 32 of the present embodiment includes the DLL circuit 1, the plurality of latches 2, 3, 4 and 5, and the constant voltage generator 7. These elements in the present embodiment are essentially the same as corresponding elements in FIG. 1, and designated by the same reference numerals and a description thereof will be omitted. The control signal generator 32 of the present embodiment further includes an AND gate 12, an AND gate 13, an AND gate 14 and an AND gate 15 as shown in FIG. 7. Further, the internal circuit 6 of the SDRAM is shown in FIG. 7. For the sake of convenience of description, suppose that the internal circuit 6 includes a command decoder of the control signal generator 32, the control signal latch 35, and other elements of the SDRAM shown in FIG. 14.

Unlike the previous embodiments of FIG. 1 and FIG. 3, in the control signal generator 32 of the present embodiment, the EXT CLK is supplied directly to the DLL circuit 1. Even when the SDRAM is set in the active power-down state, the DLL circuit 1 always outputs the INT CLK which phase is synchronized to the EXT CLK, and the INT CLK is supplied to each of the latches 2–5 and the internal circuit 6. Hence, in the present embodiment, the EXT CLK and the INT CLK are always in synchronism with each other. Further, the retained control signals LATCH CS, LATCH RAS, LATCH CAS and LATCH WE are supplied from the latches 2–5 to respective first inputs of the AND gates 12–15, and the CKE is supplied to each of respective second inputs of the AND gates 12–15.

In the present embodiment, when the CKE is set at the H level during the active state of the SDRAM, the AND gates 12–15 output the retained control signals LATCH CS, LATCH RAS, LATCH CAS and LATCH WE to the internal circuit 6. As described above, when the CKE is set at the L level and the control signals CS, RAS, CAS and WE at the inputs of the latches 2–5 are set in the active power-down setting condition shown in FIG. 15, the SDRAM is set in the active power-down state. In the present embodiment, the active power-down setting condition is, as shown in FIG. 15, that the CS signal is at the L level, the RAS signal is at the H level, the CAS signal is at the H level, and the WE signal is at the H level, or that the CS signal is at the H level, and the RAS, CAS and WE signals are either at the H level or at the L level.

In the control signal generator 32 of FIG. 7, the control signals CS, RAS, CAS and WE are retained by the latches 2, 3, 4 and 5 in synchronism with the INT CLK supplied by the DLL circuit 1. Further, the retained control signals LATCH CS, LATCH RAS, LATCH CAS and LATCH WE are supplied from the AND gates 12–15 to the internal circuit 6 when the CKE is set at the H level. On the other hand, when the CKE is set at the L level, the retained control signals LATCH CS, LATCH RAS, LATCH CAS and LATCH WE are not supplied to the internal circuit 6 regardless of whether the control signals CS, RAS, CAS and WE are at the H level or at the L level. The INT CLK output by the DLL circuit 1 is always supplied to the internal circuit 6.

Figure 8:
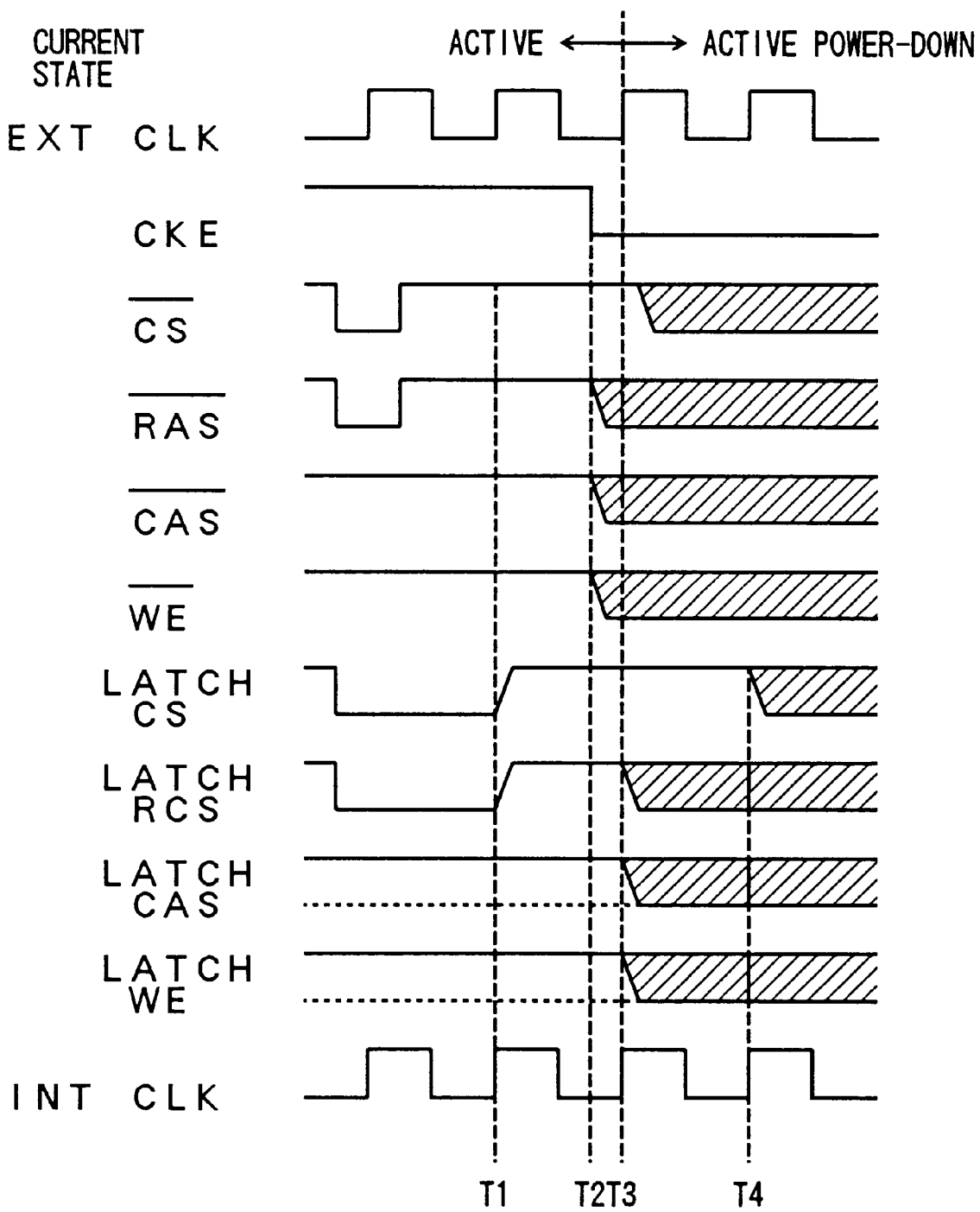
FIG. 8 is a time chart for explaining an operation of the control signal generator of FIG. 7.

FIG. 8 is a time chart for explaining an operation of the control signal generator 32 of FIG. 7. In FIG. 8, T1 indicates a time a rising edge of the INT CLK occurs during the active state, T2 indicates a time a falling edge of the CKE occurs during the active state, T3 indicates a time a first rising edge of the INT CLK occurs after the CKE is set at the L level, and T4 indicates a time a final rising edge of the INT CLK occurs after the CKE is set at the L level. As described above, in the present embodiment, the EXT CLK and the INT CLK are always in synchronism with each other.

As shown in FIG. 8, when the CKE is at the H level and the EXT CLK is set from the L level to the H level (or the rising edge of the EXT CLK) at the time "T1", the INT CLK which phase is accurately synchronized to the EXT CLK is supplied to the latches 2–5 by the DLL circuit 1. That is, at the time T1, the rising edge of the INT CLK occurs simultaneously with the rising edge of the EXT CLK. In synchronism with the rising edge of the INT CLK, the control signals CS, RAS, CAS and WE are retained by the latches 2, 3, 4 and 5, and the active state of the SDRAM is established so that all the retained control signals LATCH CS, LATCH RAS, LATCH CAS and LATCH WE are set at the H level.

Further, as shown in FIG. 8, when the CKE is set at the L level at the time T2 during the active state of the SDRAM, the active power-down setting condition shown in FIG. 15 is satisfied. The SDRAM is set from the active state to the active power-down state. That is, the EXT CLK is made invalid even when the first rising edge of the INT CLK occurs at the time T3. In the present embodiment, even when the SDRAM is set in the active power-down state, the EXT CLK is supplied to the DLL circuit 1, and the supply of the INT CLK to the latches 2–5 and the internal circuit 6 is permitted. However, the CKE is set at the L level during the active power-down state, and the AND gates 12–15 do not output the retained control signals LATCH CS, LATCH RAS, LATCH CAS and LATCH WE to the internal circuit 6. Hence, even when the control signals are supplied to the latches 2–5 during the active power-down state, they are disregarded with no regard as to whether the control signals are set at the H level or the L level, as indicated by the shaded lines in FIG. 8. The latches 2–5 are held in the conditions that are the same as those at the last rising edge of the INT CLK that occurs at the time T4.

In the SDRAM, the latches 2–5 are continuously held in the previous conditions until the active power-down state is terminated or canceled. The latches 2–5 remain in the previous conditions until the active state setting condition shown in FIG. 15 is satisfied again. That is, the SDRAM is not shifted to the active state until the CKE is set at the H level, the operation of the INT CLK is started, and the CS signal is set at the L level and the control signals RAS, CAS and WE are set at the H level, or until the CS signal is set at the H level.

As described above, the control signal generator 32 of the present embodiment includes the DLL circuit 1 which outputs the INT CLK which phase is accurately synchronized to the EXT CLK, so that the control signals are supplied to the internal circuit in synchronism with the INT CLK without delay relative to the EXT CLK. Hence, the control signal generator 32 of the present embodiment is effective in preventing a malfunction of the SDRAM due to a delay of the INT CLK relative to the EXT CLK. Even if the working frequency of the SDRAM is increased, the INT CLK is set at the H level or L level in response to the level of the EXT CLK without delay. The rising edge of the INT CLK output by the DLL circuit 1 occurs simultaneously with the rising edge of the EXT CLK. In synchronism with the rising edge of the INT CLK, the control signals CS, RAS, CAS and WE are retained by the latches 2, 3, 4 and 5, and the retained control signals LATCH CS, LATCH RAS, LATCH CAS and LATCH WE are set at the H level. Hence, the SDRAM of the present embodiment is effective in preventing the malfunction due to the delay of the INT CLK relative to the EXT CLK.

Further, when the CKE is set at the L level during the active state, the AND gates 12–15 do not output the retained control signals to the internal circuit 6. The operation of the internal circuit 6 and the operation of the AND gates 12–15 are stopped. Hence, the control signal generator 32 of the present embodiment is effective in reducing the power consumption of the internal circuit 6 in the SDRAM.

Figure 9:
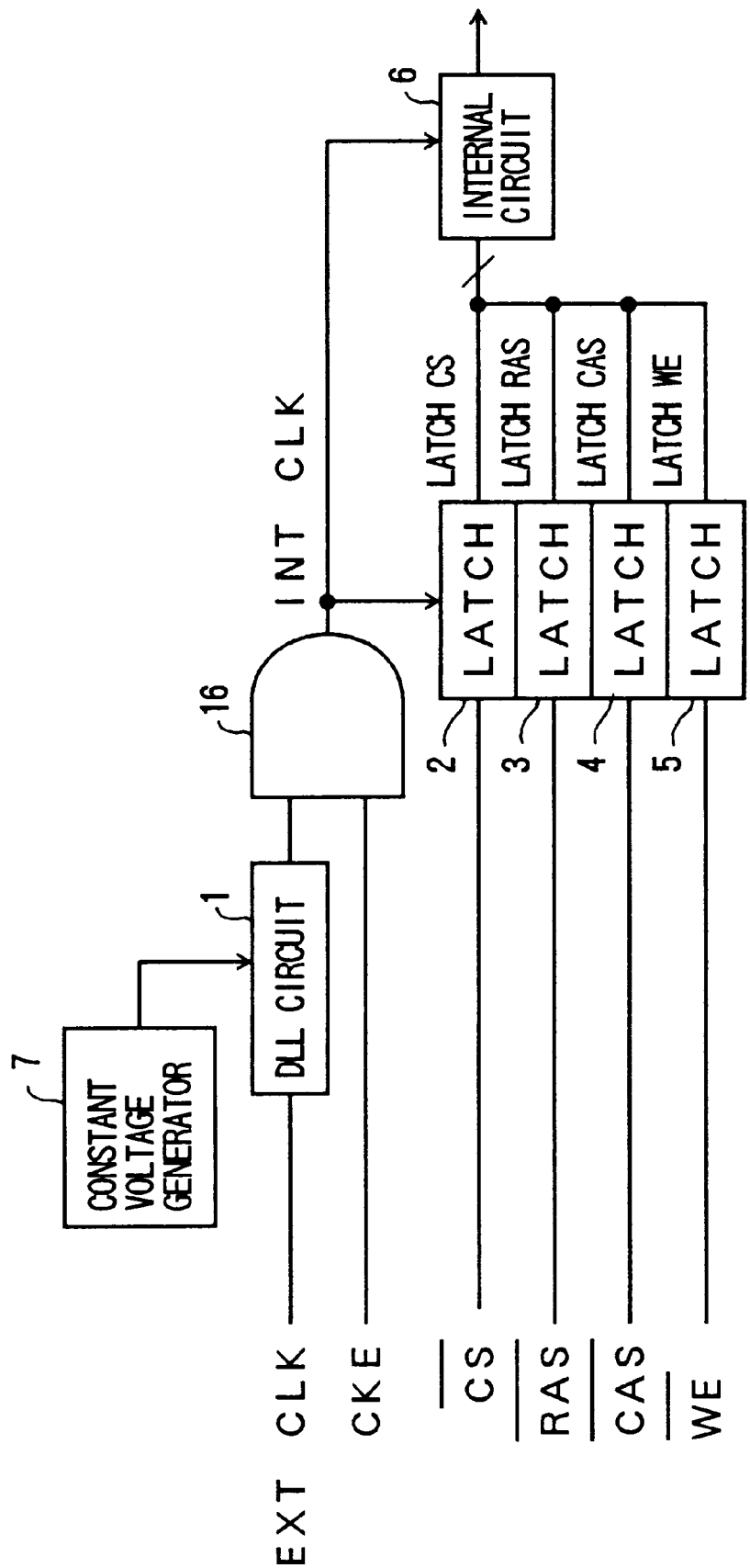
FIG. 9 is a block diagram of a fourth embodiment of the control signal generator in the SDRAM according to the present invention.

Next, FIG. 9 shows a fourth embodiment of the control signal generator in the SDRAM according to the present invention. The control signal generator 32 of the present embodiment has a configuration that is different from the configuration of the previous embodiments of FIG. 1, FIG. 3 and FIG. 7.

As shown in FIG. 9, the control signal generator 32 of the present embodiment includes the DLL circuit 1, the plurality of latches 2, 3, 4 and 5, and the constant voltage generator 7. These elements in the present embodiment are essentially the same as corresponding elements in FIG. 1, and designated by the same reference numerals and a description thereof will be omitted. The control signal generator 32 of the present embodiment further includes an AND gate 16 as shown in FIG. 9. Further, the internal circuit 6 of the SDRAM is shown in FIG. 9. For the sake of convenience of description, suppose that the internal circuit 6 includes a command decoder of the control signal generator 32, the control signal latch 35, and other elements of the SDRAM shown in FIG. 14.

Unlike the previous embodiments of FIG. 1 and FIG. 3, in the control signal generator 32 of the present embodiment, the EXT CLK is supplied directly to the DLL circuit 1, the output of the DLL circuit 1 is connected to a first input of the AND gate 16, and the CKE is supplied to a second input of the AND gate 16. Further, the AND gate 16 has an output connected to each of the latches 2–5 and the internal circuit 6. Even when the SDRAM is set in the active power-down state, the DLL circuit 1 always outputs the INT CLK which phase is synchronized to the EXT CLK, and the INT CLK is supplied to the AND gate 16. Hence, in the present embodiment, the EXT CLK and the INT CLK are always in synchronism with each other. The control signals CS, RAS, CAS and WE are retained by the latches 2–5 in synchronism with the INT CLK supplied by the AND gate 16. Further, the retained control signals LATCH CS, LATCH RAS, LATCH CAS and LATCH WE are supplied from the latches 2–5 to the internal circuit 6 in synchronism with the INT CLK supplied by the AND gate 16.

In the present embodiment, when the CKE is set at the H level during the active state of the SDRAM, the AND gate 16 outputs the INT CLK to each of the latches 2–5 and the internal circuit 6. However, when the CKE is set at the L level and the control signals CS, RAS, CAS and WE at the inputs of the latches 2–5 are set in the active power-down setting condition shown in FIG. 15, the SDRAM is set in the active power-down state. In the present embodiment, the active power-down setting condition is, as shown in FIG. 15, that the CS signal is at the L level, the RAS signal is at the H level, the CAS signal is at the H level, and the WE signal is at the H level, or that the CS signal is at the H level, and the RAS, CAS and WE signals are either at the H level or at the L level.

In the control signal generator 32 of FIG. 9, when the CKE is set at the L level, the INT CLK is not output to the latches 2–5 or the internal circuit 6 by the AND gate 16. Hence, the retained control signals LATCH CS, LATCH RAS, LATCH CAS and LATCH WE are not supplied from the latches 2–5 to the internal circuit 6 regardless of whether the control signals CS, RAS, CAS and WE are at the H level or at the L level. The INT CLK output by the DLL circuit 1 is always supplied to the AND gate 16, but when the CKE is set at the L level the AND gate 16 does not output the INT CLK.

Figure 10:
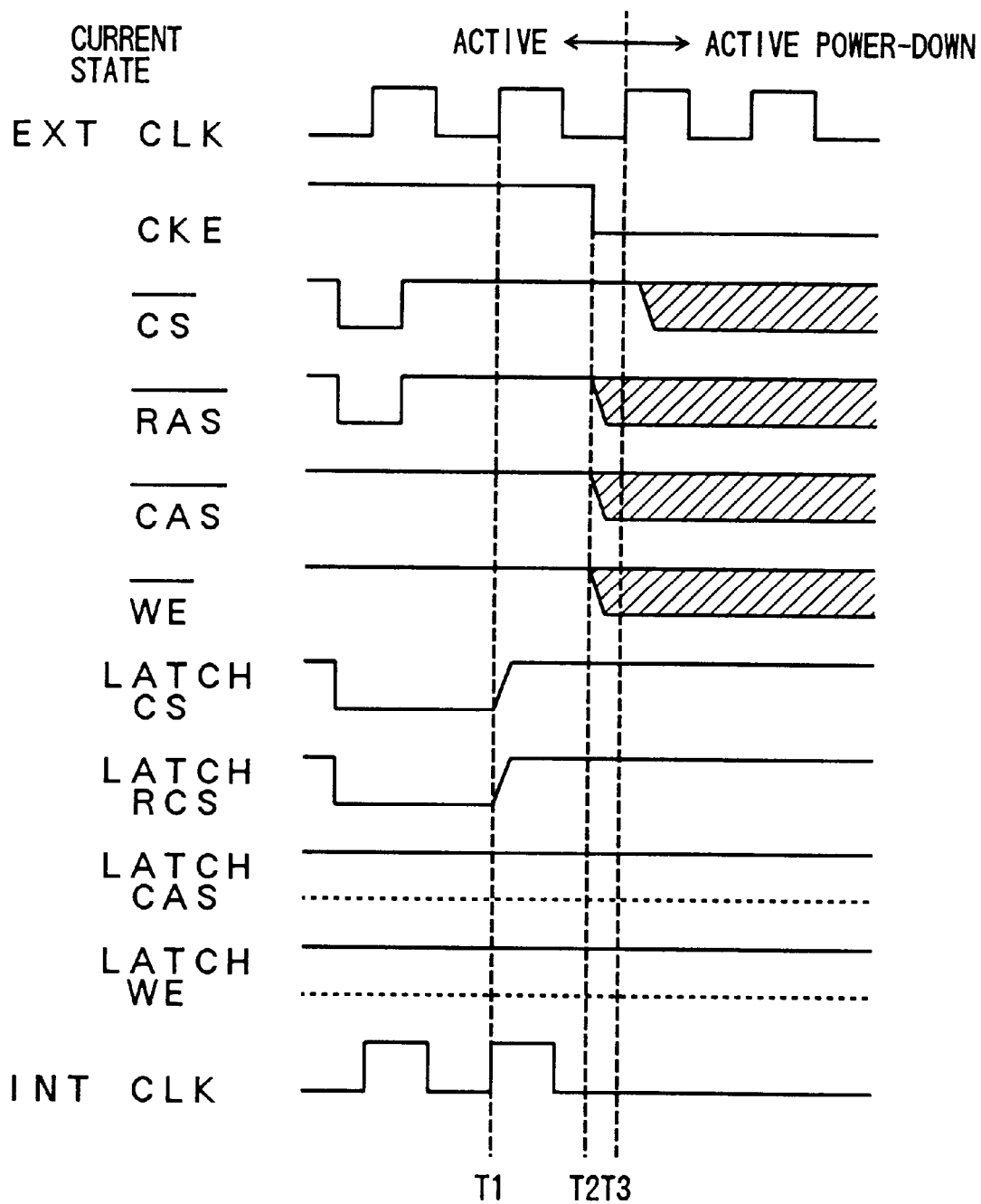
FIG. 10 is a time chart for explaining an operation of the control signal generator of FIG. 9.

FIG. 10 is a time chart for explaining an operation of the control signal generator of FIG. 9. In FIG. 10, T1 indicates a time a rising edge of the INT CLK occurs during the active state, T2 indicates a time a falling edge of the CEE occurs, and T3 indicates a time a rising edge of the EXT CLK occurs after the CKE is set at the L level. As described above, the EXT CLK and the INT CLK output by the DLL circuit 1 are always in synchronism with each other.

As shown in FIG. 10, when the CKE is at the H level and the EXT CLK is set from the L level to the H level (or the rising edge of the EXT CLK) at the time "T1", the INT CLK which phase is accurately synchronized to the EXT CLK is supplied to the latches 2–5 by the AND gate 16. That is, a rising edge of the INT CLK occurs simultaneously with the rising edge of the EXT CLK. In synchronism with the rising edge of the INT CLK, the control signals CS, RAS, CAS and WE are retained by the latches 2, 3, 4 and 5, and the active state of the SDRAM is established so that all the retained control signals LATCH CS, LATCH RAS, LATCH CAS and LATCH WE are set at the H level.

Further, as shown in FIG. 10, when the CKE is set at the L level at the time T2 during the active state of the SDRAM, the active power-down setting condition shown in FIG. 15 is satisfied. The SDRAM is set from the active state to the active power-down state. That is, the EXT CLK is made invalid even when the rising edge of the EXT CLK occurs at the time T3. In the SDRAM, when it is set in the active power-down state, the supply of the INT CLK from the AND gate 16 to the latches 2–5 and the internal circuit 6 is inhibited. The control signals supplied to the latches 2–5 are disregarded with no regard as to whether the control signals are set at the H level or the L level, as indicated by the shaded lines in FIG. 10. The latches 2–5 are held in the conditions that are the same as those at the last rising edge of the INT CLK at the time T1.

In the SDRAM, the latches 2–5 are continuously held in the previous conditions until the active power-down state is terminated or canceled. The latches 2–5 remains in the previous conditions until the active state setting condition shown in FIG. 15 is satisfied again. That is, the SDRAM is not shifted to the active state until the CKE is set at the H level, the operation of the INT CLK is started, and the CS signal is set at the L level and the control signals RAS, CAS and WE are set at the H level, or until both the CKE and the CS are set at the H level, as shown in FIG. 15.

As described above, the control signal generator 32 of the present embodiment includes the DLL circuit 1 which outputs the INT CLK which phase is accurately synchronized to the EXT CLE, so that the control signals are supplied to the internal circuit in synchronism with the INT CLK without delay relative to the EXT CLK. Hence, the control signal generator 32 of the present embodiment is effective in preventing a malfunction of the SDRAM due to a delay of the INT CLK relative to the EXT CLK. Even if the working frequency of the SDRAM is increased, the INT CLK is set at the H level or L level in response to the level of the EXT CLK without delay. The rising edge of the INT CLK output by the DLL circuit 1 occurs simultaneously with the rising edge of the EXT CLK. In synchronism with the rising edge of the INT CLK, the control signals CS, RAS, CAS and WE are retained by the latches 2, 3, 4 and 5, and the retained control signals LATCH CS, LATCH RAS, LATCH CAS and LATCH WE are set at the H level. Hence, the semiconductor integrated circuit device of the present embodiment is effective in preventing the malfunction due to the delay of the INT CLK relative to the EXT CLK.

Further, when the CKE is set at the L level during the active state, the INT CLK is not supplied to the latches 2–5 and the internal circuit 6 by the AND gate 16. Hence, the control signal generator 32 of the present embodiment is effective in reducing the power consumption of the latches 2–5 and the internal circuit 6 in the SDRAM.

The control signal generator 32 of the present embodiment differs from the embodiments of FIG. 1 and FIG. 3 in that the DLL circuit 1 outputs the INT CLK which phase is synchronized to the EXT CLK even when the SDRAM is in the active power-down state. The control signal generator 32 of the present embodiment differs from the embodiment of FIG. 7 in that the supply of the INT CLK to the latches 2–5 and the internal circuit 6 is inhibited during the active power-down state of the SDRAM.

Figure 11:
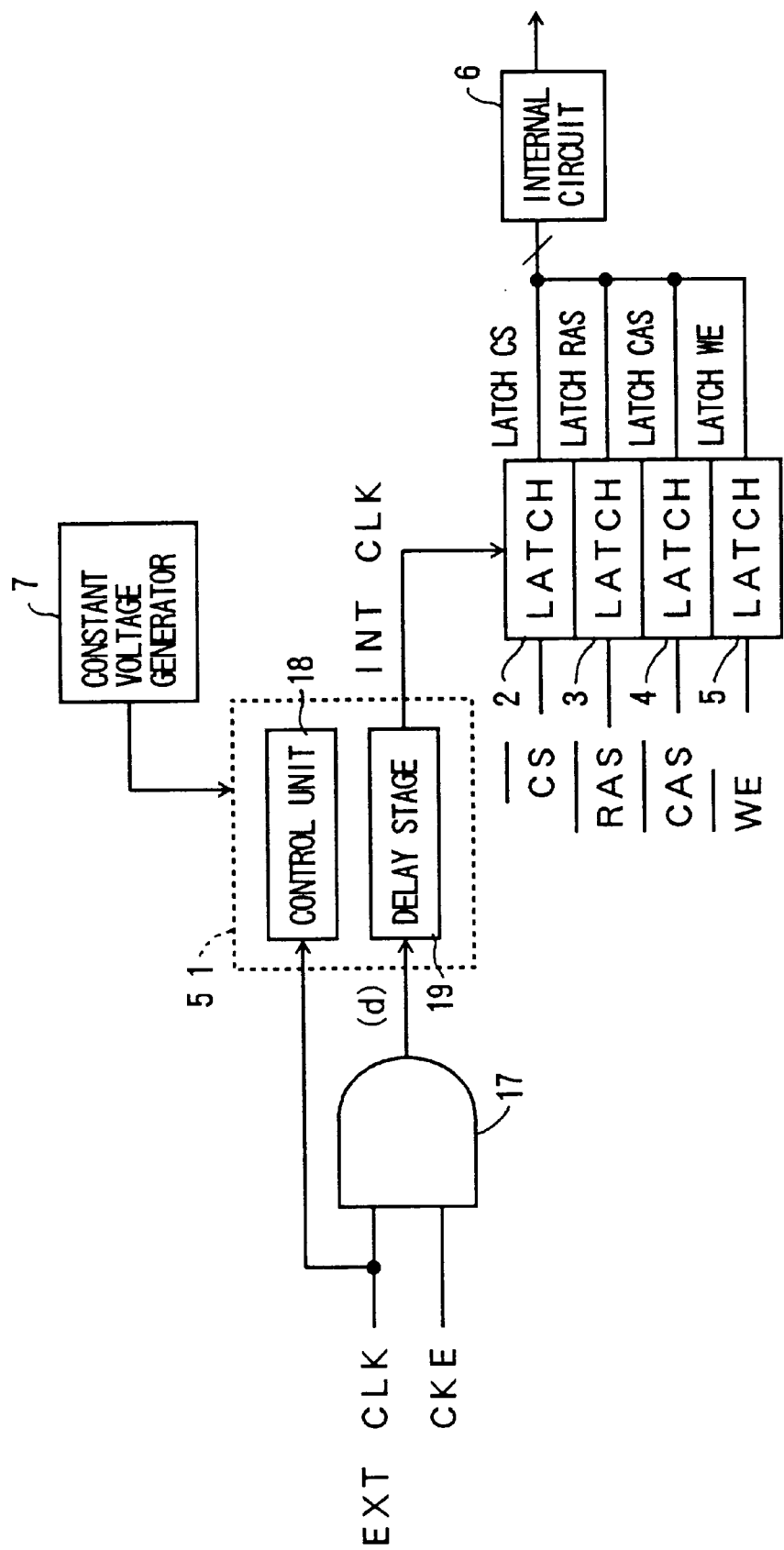
FIG. 11 is a block diagram of a fifth embodiment of the control signal generator in the SDRAM according to the present invention.

Next, FIG. 11 shows a fifth embodiment of the control signal generator 32 in the SDRAM according to the present invention. A DLL circuit 51 in the control signal generator 32 of the present embodiment has a configuration different from the configuration of the DLL circuit 1 of the previous embodiment of FIG. 1.

As shown in FIG. 11, the control signal generator 32 of the present embodiment includes the plurality of latches 2, 3, 4 and 5, the constant voltage generator 7, and the internal circuit 6. These elements in the present embodiment are essentially the same as corresponding elements in FIG. 1, and designated by the same reference numerals and a description thereof will be omitted. The control signal generator 32 of the present embodiment further includes an AND gate 17 as shown in FIG. 11.

In the control signal generator 32 of the present embodiment, the DLL circuit 51 includes a control unit 18 and a delay stage 19. The delay stage 19 includes a plurality of delay circuits and is capable of inserting a variable delay to the EXT CLK by selecting the delay circuits. The control unit 18 controls the delay stage 19 based on the EXT CLK so that a variable delay is inserted to the EXT CLK, and the delay stage 19 outputs the INT CLK in accordance with the delayed EXT CLK.

In the control signal generator 32 of the present embodiment, the EXT CLK is supplied directly to the control unit 18 of the DLL circuit 51. The EXT CLK and the CKE are supplied to the AND gate 17, and the AND gate 17 outputs a signal (d) to the delay stage 19 of the DLL circuit 51. The INT CLK output by the delay stage 19 is supplied to the latches 2–5. The control signals CS, RAS, CAS and WE are retained by the latches 2–5 in synchronism with the INT CLK supplied by the DLL circuit 51. Further, the retained control signals LATCH CS, LATCH RAS, LATCH CAS and LATCH WE are supplied from the latches 2–5 to the internal circuit 6.

In the present embodiment, when the CKE is set at the H level during the active state of the SDRAM, the AND gate 17 outputs the signal (d) that is the same as the EXT CLK, to the delay stage 19. In this condition, the DLL circuit 51 outputs the INT CLK which phase is synchronized to the EXT CLK, and the INT CLK is supplied to the latches 2–5. On the other hand, when the CKE is set at the L level, the signal (d) at the output of the AND gate 17 is set at the L level, and the EXT CLK is not supplied to the delay stage 19. In this condition, the supply of the INT CLK to the latches 2–5 by the DLL circuit 51 is inhibited.

In the present embodiment, when the CKE is set at the L level and the control signals CS, RAS, CAS and WE at the inputs of the latches 2–5 are set in the active power-down setting condition shown in FIG. 15, the SDRAM is set in the active power-down state similar to the previous embodiment of FIG. 1.

In the control signal generator 32 of FIG. 11, when the CKE is set at the L level, the INT CLK is not output to the latches 2–5 by the DLL circuit 51. Hence, the retained control signals LATCH CS, LATCH RAS, LATCH CAS and LATCH WE are not supplied from the latches 2–5 to the internal circuit 6, regardless of whether the control signals CS, RAS, CAS and WE are at the H level or at the L level. The INT CLK output by the DLL circuit 51 is supplied to the latches 2–5 when the CKE is set at the H level, but when the CKE is set at the L level the DLL circuit 51 does not output the INT CLK to the latches 2–5.

Figure 12:
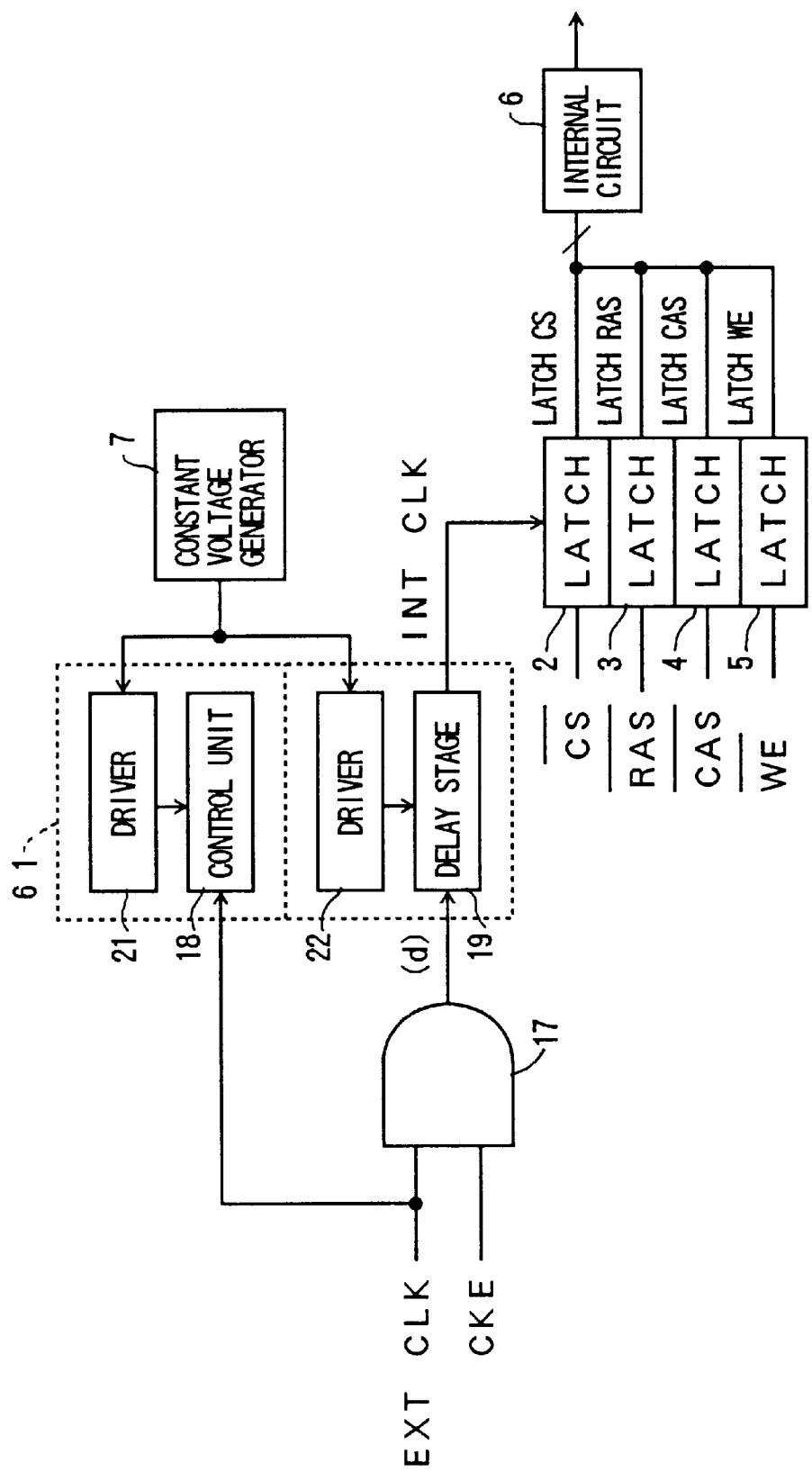
FIG. 12 is a block diagram of a sixth embodiment of the control signal generator in the SDRAM according to the present invention.

FIG. 12 shows a sixth embodiment of the control signal generator 32 in the SDRAM according to the present invention. A DLL circuit 61 in the control signal generator 32 of the present embodiment has a configuration different from the configuration of the DLL circuit 1 of the previous embodiment of FIG. 1.

As shown in FIG. 12, the control signal generator 32 of the present embodiment includes the plurality of latches 2, 3, 4 and 5, the constant voltage generator 7, and the internal circuit 6. These elements in the present embodiment are essentially the same as corresponding elements in FIG. 1, and designated by the same reference numerals and a description thereof will be omitted. The control signal generator 32 of the present embodiment further includes the AND gate 17 which is essentially the same as that shown in FIG. 11.

In the control signal generator 32 of the present embodiment, the DLL circuit 61 includes a control unit 18, a delay stage 19, a driver 21, and a driver 22. The delay stage 19 includes a plurality of delay circuits and is capable of inserting a delay to the EXT CLK by selecting the delay circuits. The control unit 18 controls the delay stage 19 based on the EXT CLK so that a delay is inserted to the EXT CLK and the delay stage 19 outputs the INT CLK.

In the previous embodiment of FIG. 11, during the active state of the SDRAM, both the control unit 18 and the delay stage 19 work. However, during the active power-down state of the SDRAM, the EXT CLK is not supplied to the delay stage 19. In this condition, no current is supplied to the delay stage 19, and only the control unit 18 works. A level of the voltage of the delay stage 19 may vary during the active power-down stage, and a fluctuation of the voltage of the delay stage 19 may affect the operation of the control unit 18.

In the control signal generator 32 of FIG. 12, the driver 21 which supplies current to the control unit 18, and the driver 22 which supplies current to the delay stage 19 are separately provided. The accuracy of the operation of the DLL circuit 61 is ensured by setting a current supply ability ratio related to the current supply abilities of the drivers 21 and 22 to be substantially equal to a current consumption ratio related to the current consumption of the control unit 18 and the delay stage 19. In the control signal generator 32 of the present embodiment, a constant voltage is supplied to the control unit 18 by the driver 21. Hence, the accuracy of the operation of the DLL circuit 61 in the control signal generator 32 of the present embodiment is ensured, regardless of whether the SDRAM is in the active state or in the active power-down state. Other operation of the control signal generator 32 of FIG. 12 is essentially the same as the operation of the control signal generator 32 of FIG. 11.

Figure 16:
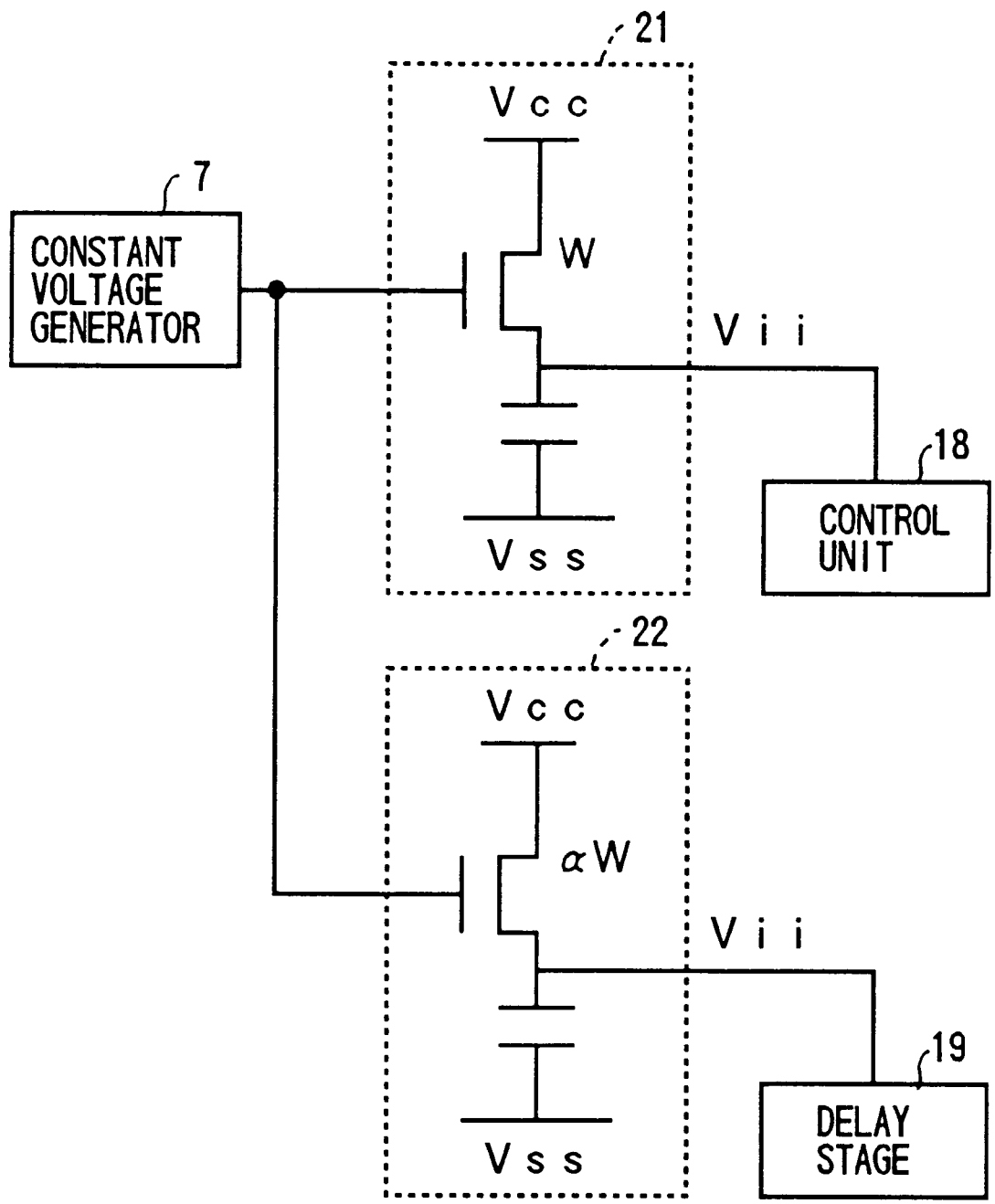
FIG. 16 is a circuit diagram of drivers provided in a DLL circuit of the control signal generator of FIG. 12.

FIG. 16 is a circuit diagram of the driver 21 and the driver 22 in the DLL circuit 61 of the control signal generator 32 of FIG. 12. The driver 21 and the driver 22 are constructed by using transistors as shown in FIG. 16. In the present embodiment, a width W of a transistor of the driver 21 and a width αW of a transistor of the driver 22 are preset such that the current supply ability ratio a related to the current supply abilities of the drivers 21 and 22 is set to be substantially equal to the current consumption ratio related to the current consumption of the control unit 18 and the delay stage 19. In the control signal generator 32 of the present embodiment, a constant voltage Vii is supplied to the control unit 18 by the driver 21 and a constant voltage Vii is supplied to the delay stage 19, regardless of whether the SDRAM is in the active state or in the active power-down state.

Figure 13:
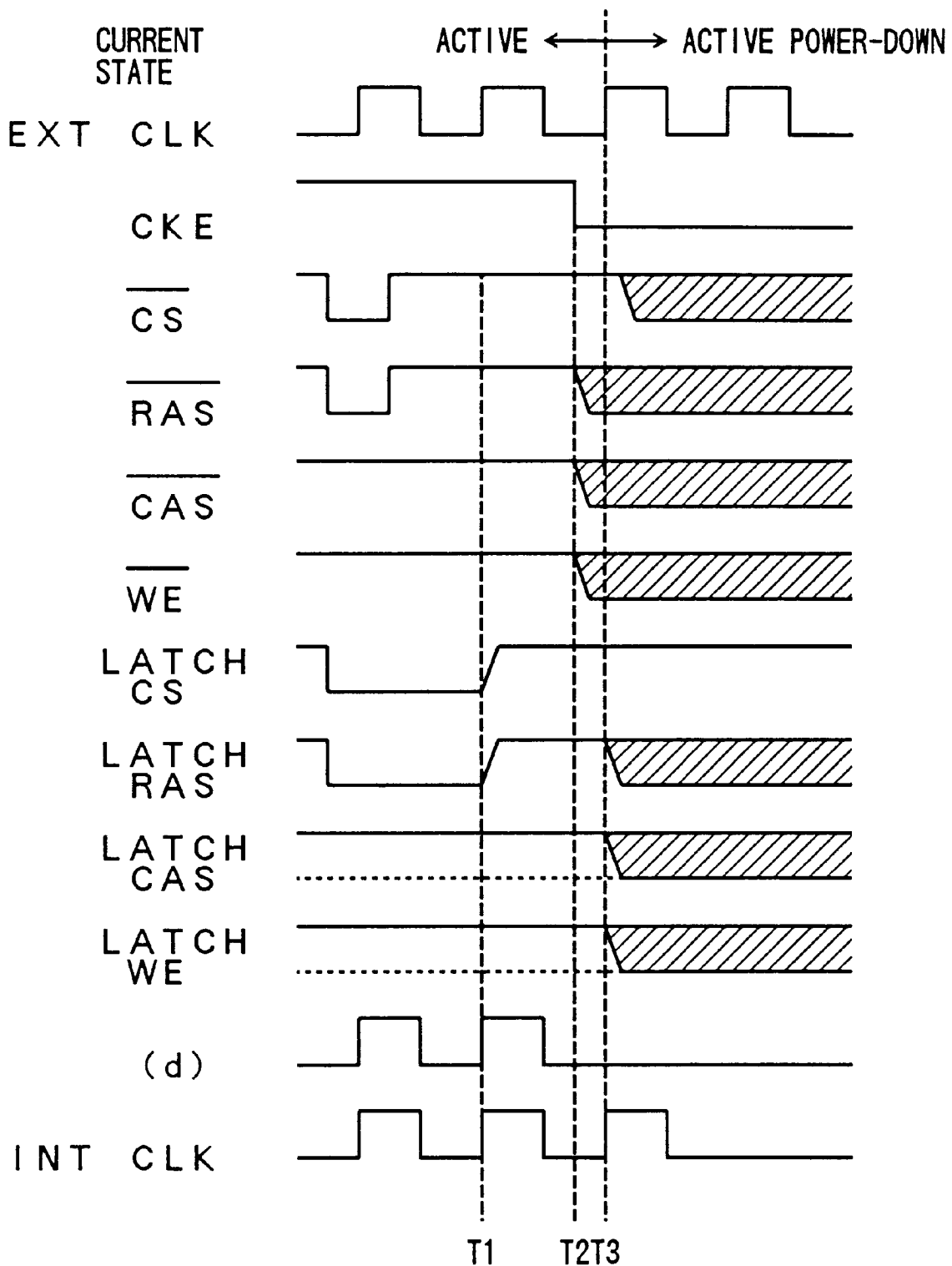
FIG. 13 is a time chart for explaining an operation of each of the control signal generators of FIG. 11 and FIG. 12.

FIG. 13 is a time chart for explaining an operation of each of the control signal generators 32 of FIG. 11 and FIG. 12. In FIG. 13, T1 indicates a time a rising edge of the EXT CLE occurs during the active state, T2 indicates a time a falling edge of the CKE occurs during the active state, and T3 indicates a time a rising edge of the EXT CLK occurs after the CKE is set at the L level.

As shown in FIG. 13, when the CKE is at the E level and the EXT CLK is set from the L level to the H level (or the rising edge of the EXT CLK) at the time "T1", the INT CLK which phase is accurately synchronized to the EXT CLK is supplied to the latches 2–5 by the DLL circuit 51 or 61. That is, a rising edge of the INT CLK occurs simultaneously with the rising edge of the EXT CLK. In synchronism with the rising edge of the INT CLK, the control signals CS, RAS, CAS and WE are retained by the latches 2, 3, 4 and 5, and the active state of the SDRAM is established so that all the retained control signals LATCH CS, LATCH RAS, LATCH CAS and LATCH WE are set at the H level.

Further, as shown in FIG. 13, when the CKE is set at the L level at the time T2 during the active state of the SDRAM, the active power-down setting condition shown in FIG. 15 is satisfied. The SDRAM is set from the active state to the active power-down state. That is, the EXT CLK is made invalid even when the rising edge of the EXT CLK occurs at the time T3. As described above, when the CKE is set at the L level, the signal (d) at the output of the AND gate 17 is set at the L level, and the EXT CLK is not supplied to the delay stage 19. In this condition, the supply of the INT CLK to the latches 2–5 by the DLL circuit 51 or 61 is inhibited. The control signals supplied to the latches 2–5 are disregarded with no regard as to whether the control signals are set at the H level or the L level, as indicated by the shaded lines in FIG. 13. The latches 2–5 are held in the conditions that are the same as those at the last rising edge of the INT CLK at the time T3.

In the SDRAM, the latches 2–5 are continuously held in the previous conditions until the active power-down state is terminated or canceled. The latches 2–5 remains in the previous conditions until the active state setting condition shown in FIG. 15 is satisfied again. That is, the SDRAM is not shifted to the active state until the CKE is set at the H level, the operation of the INT CLK is started, and the CS signal is set at the L level and the control signals RAS, CAS and WE are set at the H level, or until both the CKE and the CS are set at the H level, as shown in FIG. 15.

As described above, the control signal generator 32 of the present embodiment includes the DLL circuit which outputs the INT CLK which phase is accurately synchronized to the EXT CLK, so that the control signals are supplied to the internal circuit in synchronism with the INT CLK without delay relative to the EXT CLK. Hence, the control signal generator 32 of the present embodiment is effective in preventing a malfunction of the SDRAM due to a delay of the INT CLK relative to the EXT CLK. Even if the working frequency of the SDRAM is increased, the INT CLK is set at the H level or L level in response to the level of the EXT CLK without delay. The rising edge of the INT CLK output by the DLL circuit 51 or 61 occurs simultaneously with the rising edge of the EXT CLK. In synchronism with the rising edge of the INT CLK, the control signals CS, RAS, CAS and WE are retained by the latches 2, 3, 4 and 5, and the retained control signals LATCH CS, LATCH RAS, LATCH CAS and LATCH WE are set at the H level. Hence, the semiconductor integrated circuit device of the present embodiment is effective in preventing the malfunction due to the delay of the INT CLK relative to the EXT CLK.

Further, when the CKE is set at the L level during the active state, the EXT CLK is not supplied to the DLL circuit 51 or 61. The DLL circuit 51 or 61 does not output the INT CLK, and no INT CLK is supplied to the latches 2–5. Hence, the control signal generator 32 of the present embodiment is effective in reducing the power consumption of the latches 2–5 in the SDRAM.

Figure 17:
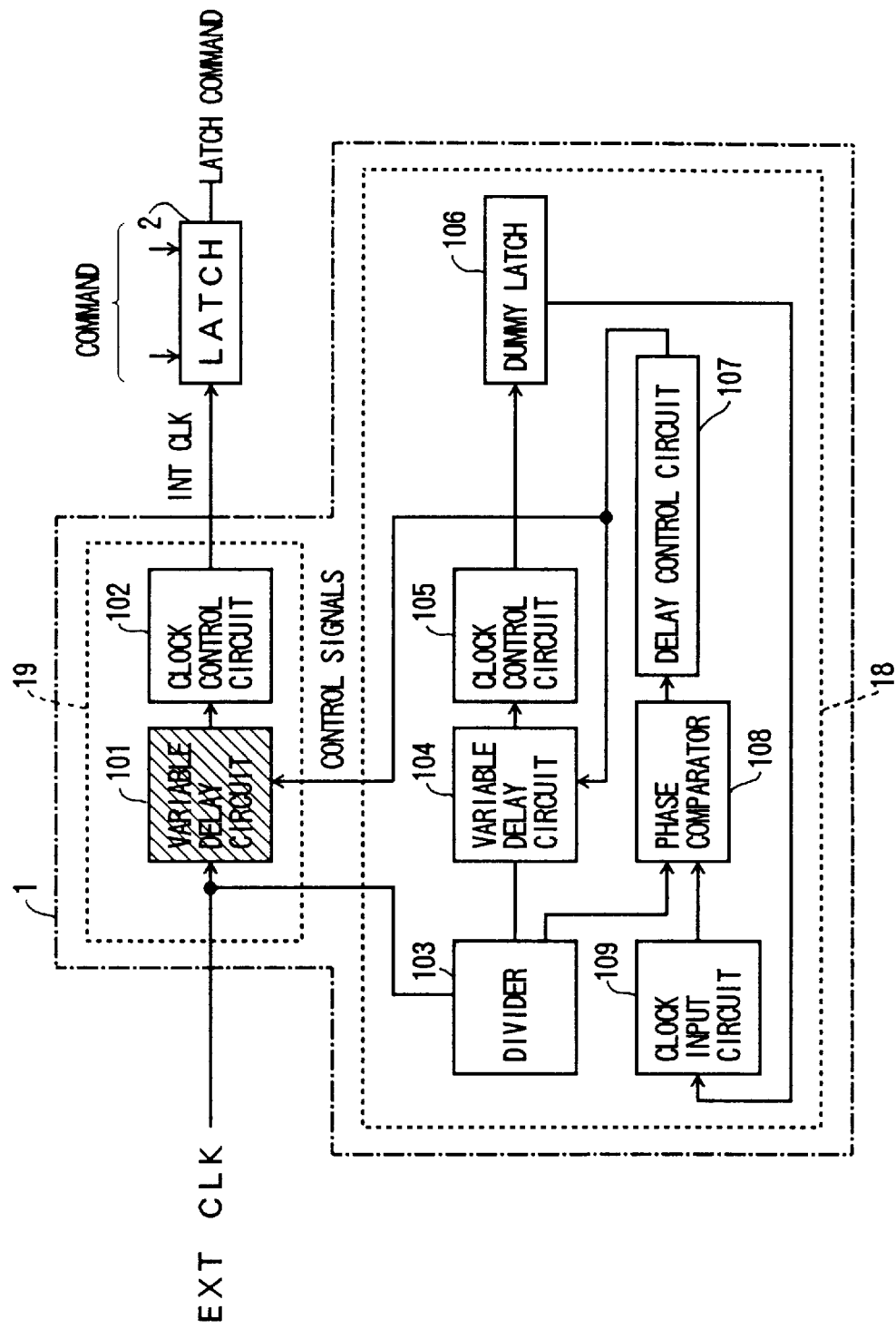
FIG. 17 is a block diagram of a DLL circuit provided in the SDRAM according to the present invention.

FIG. 17 shows a configuration of the DLL circuit 1 provided in the SDRAM according to the present invention.

As shown in FIG. 17, the DLL circuit 1 generally has the control unit 18 and the delay stage 19 similar to the embodiment of FIG. 11. The stage 19 includes a variable delay circuit 101 and a clock control circuit 102. The control unit 18 includes a divider 103, a variable delay circuit 104, a clock control circuit 105, a dummy latch 106, a delay control circuit 107, a phase comparator 108, and a clock input circuit 109. The control unit 18 controls the delay stage 19 based on the EXT CLK, so that a variable delay is inserted to the EXT CLK, and the delay stage 19 outputs the INT CLK which phase is synchronized to the EXT CLK with the inserted delay.

In the DLL circuit 1 of FIG. 17, the variable delay circuit 101 functions to determine a variable delay, which is inserted to the EXT CLK, by using a plurality of delay circuits included in the variable delay circuit 101. The clock control circuit 102 functions to output an INT CLK in accordance with the delayed EXT CLK output from the variable delay circuit 101.

The divider 103 converts a frequency of the EXT CLK into a reference frequency and outputs a timing signal based on the reference frequency to start execution of a phase comparison. The variable delay circuit 104 functions to determine a variable delay, which is inserted to the EXT CLK, by using a plurality of delay circuits included in the variable delay circuit 104. The clock control circuit 105 outputs an intermediate clock in accordance with the delayed EXT CLK from the variable delay circuit 104. The dummy latch 106 retains the intermediate clock output by the clock control circuit 105. The clock input circuit 109 supplies the intermediate clock, retained by the dummy latch 106, to the phase comparator 108.

The phase comparator 108 detects a difference in phase between the EXT CLX supplied by the divider 103 and the intermediate clock supplied by the clock input circuit 109. The delay control circuit 107 functions to control the variable delay circuit 101 based on the phase difference detected by the phase comparator 108, so that the clock control circuit 102 outputs the INT CLK in accordance with the delayed EXT CLK.

Figure 18:
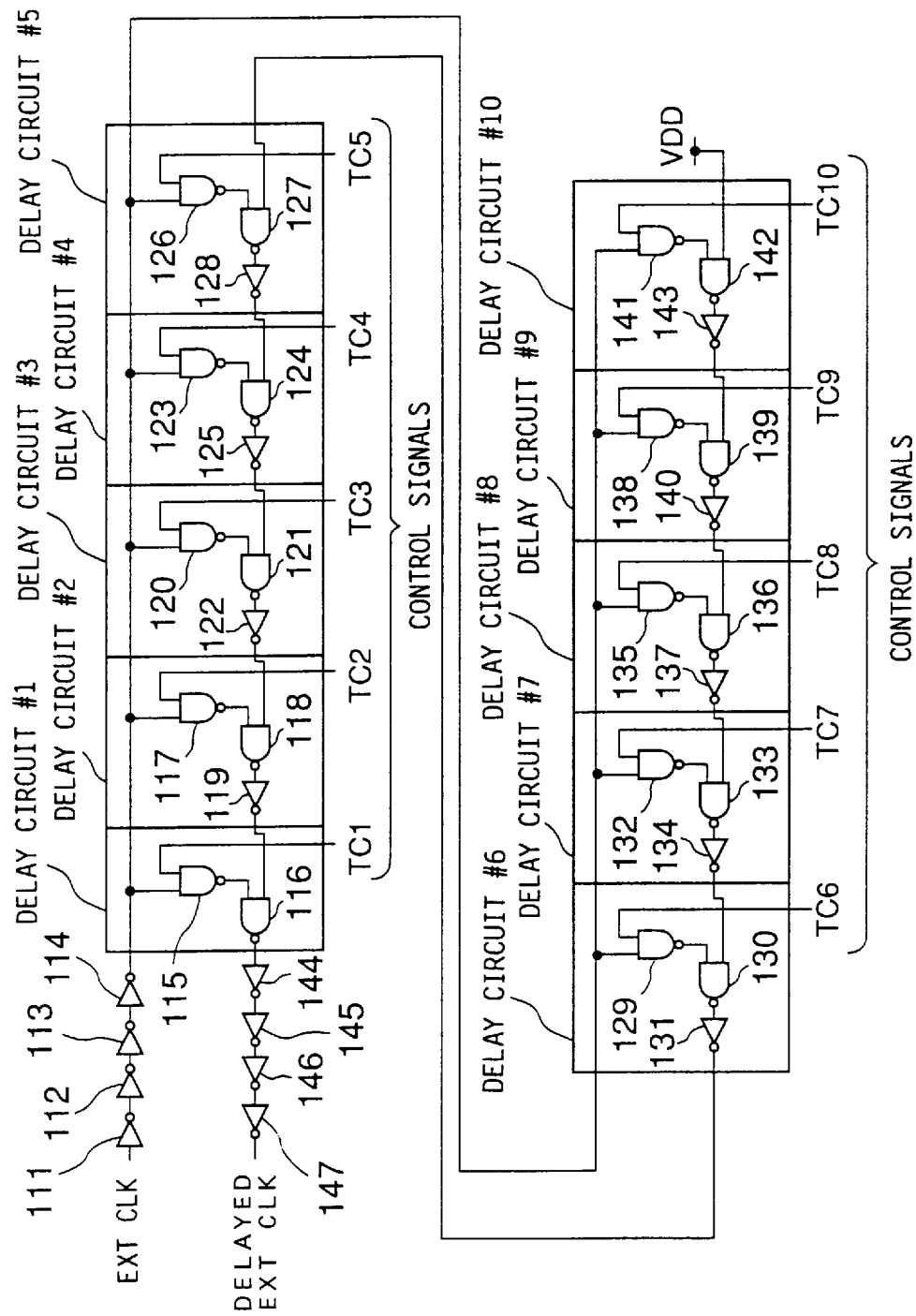
FIG. 18 is a circuit diagram of a variable delay circuit of the DLL circuit of FIG. 17.

FIG. 18 shows an example of the variable delay circuit 101 of the DLL circuit of FIG. 17.

As shown in FIG. 18, the variable delay circuit 101 includes a plurality of delay circuits. In the example of FIG. 18, ten delay circuits #1 through #10 are included in the variable delay circuit 101. The variable delay circuit 101 further includes input inverters 111, 112, 113 and 114, and output inverters 144, 145, 146 and 147. The delay circuit #1 includes two NAND gates 115 and 116. The delay circuit #2 includes two NAND gates 117 and 118, and an inverter 119. The delay circuit #3 includes two NAND gates 120 and 121, and an inverter 122. The delay circuit #4 includes two NAND gates 123 and 124, and an inverter 125. The delay circuit #5 includes two NAND gates 126 and 127, and an inverter 128. The delay circuit #6 includes two NAND gates 129 and 130, and an inverter 131. The delay circuit #7 includes two NAND gates 132 and 133, and an inverter 134. The delay circuit #8 includes two NAND gates 135 and 136, and an inverter 137. The delay circuit #9 includes two NAND gates 138 and 139, and an inverter 140. The delay circuit #10 includes two NAND gates 141 and 142, and an inverter 143. Each of the delay circuits #1 through #10 has an input terminal connected to an input of one of the two NAND gates of each delay circuit. Control signals TC1 through TC10 from the delay control circuit 107 are supplied to the input terminals of the delay circuits #1 through #10.

In the present embodiment, one of the control signals TC1–TC10 is set at the H level and the others are set at the L level, and such control signals TC1–TC10 are supplied to the variable delay circuit 101 by the delay control circuit 107. Hence, the variable delay circuit 101 determine a variable delay, which is inserted to the EXT CLK, by using an output of the delay circuits #1 through #10 in response to the control signals TC1 through TC10. The variable delay circuit 101 outputs a delayed EXT CLK to the clock control circuit 102. Suppose that each of the respective gates 111 through 147 included in the variable delay circuit 101 provides an identical delay time for the EXT CLK when the EXT CLK is transmitted through that gate. Hereinafter, the delay time provided by each gate is indicated by 1 "td".

For example, when the TC1 is set at the H level and the TC2–TC10 are set at the L level, the NAND gate 115 acts as an inverter responsive to the output of the inverter 114, and the NAND gates 117, 120, 123, 126, 129, 132, 135, 138 and 141 always output the H-level signals. The inverter 119 always outputs the H-level signal. The NAND gate 116 acts as an inverter responsive to the output of the NAND gate 115. The EXT CLE is transmitted through the input inverters 111–114, the NAND gates 115 and 116 and the output inverters 144–147. In this case, the variable delay circuit 101 outputs a delayed EXT CLK to the clock control circuit 102, and a delay time of the delayed EXT CLK relative to the EXT CLK corresponds to 10 td.

Similarly, when the TC2 is set at the H level and the other control signals are set at the L level, the delay time of the delayed EXT CLK, output by the variable delay circuit 101, corresponds to 12 td relative to the EXT CLK. When the TC3 is set at the H level and the other control signals are set at the L level, the delay time of the delayed EXT CLK corresponds to 14 td relative to the EXT CLK. When the TC4 is set at the H level and the other control signals are set at the L level, the delay time of the delayed EXT CLK corresponds to 16 td relative to the EXT CLK. When the TC5 is set at the H level and the other control signals are set at the L level, the delay time of the delayed EXT CLK corresponds to 18 td relative to the EXT CLK. When the TC6 is set at the H level and the other control signals are set at the L level, the delay time of the delayed EXT CLK corresponds to 20 td relative to the EXT CLK. When the TC7 is set at the H level and the other control signals are set at the L level, the delay time of the delayed EXT CLK corresponds to 22 td relative to the EXT CLK. When the TC8 is set at the H level and the other control signals are set at the L level, the delay time of the delayed EXT CLK corresponds to 24 td relative to the EXT CLK. When the TC9 is set at the H level and the other control signals are set at the L level, the delay time of the delayed EXT CLK corresponds to 26 td relative to the EXT CLK. When the TC10 is set at the H level and the other control signals are set at the L level, the delay time of the delayed EXT CLK corresponds to 28 td relative to the EXT CLK.

Accordingly, it is possible for the variable delay circuit 101 of the present embodiment to output a delayed EXT CLK to the clock control circuit 102, the delayed EXT CLK being adjusted to an appropriate one in the range between 10 td and 28 td.

Further, the present invention is not limited to the above-described embodiments, and variations and modifications may be made without departing from the scope of the present invention.

The present invention is based on Japanese priority application No. 9-346767, filed on Dec. 16, 1997, the entire contents of which are hereby incorporated by reference.

What is claimed is:

1. A semiconductor integrated circuit in which an external clock, externally supplied to the semiconductor integrated circuit, is made invalid when the semiconductor integrated circuit is set in an active power-down state, comprising:
   a delay locked loop DLL circuit for outputting an internal clock which phase is synchronized to the external clock;
   a latch circuit for retaining control signals in synchronism with the internal clock output by the DLL circuit; and
   an internal circuit for performing a predetermined process based on the control signals supplied from the latch circuit.

2. The circuit according to claim 1, further comprising inhibiting means for inhibiting the supply of the external clock to the DLL circuit when the circuit is set in the active power-down state.

3. The circuit according to claim 1, further comprising inhibiting means for inhibiting the supply of the control signals, retained by the latch circuit, to the internal circuit when the circuit is set in the active power-down state.

4. The circuit according to claim 1, further comprising inhibiting means for inhibiting the supply of the internal clock, output by the DLL circuit, to the latch circuit when the circuit is set in the active power-down state.

5. The circuit according to claim 1, wherein the DLL circuit comprises:
   a delay insertion unit for inserting a variable delay to the external clock by selecting one of a plurality of delay circuits; and
   a control unit for controlling the delay insertion unit based on the external clock so that a variable delay is inserted to the external clock, and the delay insertion unit outputs the internal clock,
   wherein said circuit further comprising means for inhibiting the supply of the external clock to the delay insertion unit of the DLL circuit when the circuit is set in the active power-down state.

6. The circuit according to claim 5, wherein the DLL circuit further comprises:
   a first driver for supplying current to the control unit; and
   a second driver for supplying current to the delay insertion unit even when the circuit is set in the active power-down state.

7. The circuit according to claim 1, further comprising a constant voltage generator for supplying a constant voltage to the DLL circuit.

8. The circuit according to claim 1, wherein the internal circuit includes a control signal latch and a memory core, the internal circuit performs a data writing process to write data to the memory core or a data reading process to read data from the memory core based on the control signals.

9. The circuit according to claim 2, wherein said inhibiting means comprises a gate having an external clock input and a clock enable signal input, and an output of the gate is connected to an input of the DLL circuit.

10. The circuit according to claim 3, wherein said inhibiting means comprises a gate having an input connected to the latch circuit, a clock enable signal input, and an output connected to the internal circuit.

11. A semiconductor device including an integrated circuit in which an external clock, externally supplied to the integrated circuit, is made invalid when the integrated circuit is set in an active power-down state, comprising:
   a delay locked loop DLL circuit for outputting an internal clock which phase is synchronized to the external clock;
   a latch circuit for retaining control signals in synchronism with the internal clock output by the DLL circuit; and
   an internal circuit for performing a predetermined process based on the control signals supplied from the latch circuit.

* * * * *